United States Patent
Iwamoto et al.

(10) Patent No.: US 9,405,321 B2
(45) Date of Patent: Aug. 2, 2016

(54) ELECTRONIC DEVICE

(71) Applicant: Panasonic Intellectual Property Management Co., Ltd., Osaka-shi, Osaka (JP)

(72) Inventors: Akira Iwamoto, Osaka (JP); Kenichi Shindo, Osaka (JP); Noriyuki Maki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/582,466

(22) Filed: Dec. 24, 2014

(65) Prior Publication Data
US 2015/0189779 A1    Jul. 2, 2015

(30) Foreign Application Priority Data

Dec. 27, 2013  (JP) ................................. 2013-271275
Dec. 5, 2014   (JP) ................................. 2014-247285

(51) Int. Cl.
*G06F 1/16*  (2006.01)
*H05K 5/02*  (2006.01)

(52) U.S. Cl.
CPC ............ *G06F 1/1633* (2013.01); *G06F 1/1656* (2013.01); *H05K 5/0221* (2013.01); *H05K 5/0239* (2013.01)

(58) Field of Classification Search
CPC ... G06F 1/1633; G06F 1/1656; H05K 5/0239; H05K 5/0221
USPC ............ 361/679.01, 679.02, 679.55–679.58, 361/724–727
See application file for complete search history.

(56) References Cited

U.S. PATENT DOCUMENTS

| | | | | |
|---|---|---|---|---|
| 5,950,639 A | * | 9/1999 | Suzuki | ................ A45C 13/008 132/294 |
| 2005/0205370 A1 | * | 9/2005 | Kanno | ..................... B60R 7/04 188/290 |
| 2010/0242367 A1 | | 9/2010 | Kawai et al. | |
| 2013/0222986 A1 | | 8/2013 | Nakatsu | |

FOREIGN PATENT DOCUMENTS

| JP | 2002353647 A | * | 12/2002 |
|---|---|---|---|
| JP | 2010-225402 | | 10/2010 |
| JP | 2013-175379 | | 9/2013 |

* cited by examiner

*Primary Examiner* — Anthony Haughton
*Assistant Examiner* — Ingrid Wright
(74) *Attorney, Agent, or Firm* — Hamre, Schumann, Mueller & Larson, P.C.

(57) ABSTRACT

When the lid is rotated in the closing direction toward the first predetermined state from a second predetermined state where the lid is in an open state and the outer lid at a locked position, the projection of the outer lid and a wall portion of the case are brought into contact with each other in the gap, an inclined surface is formed on at least one of a portion, which is brought into contact with the wall portion of the case, of the projection of the outer lid and a portion, which is brought into contact with the projection of the outer lid, of the wall portion of the case, wherein the inclined surface is formed in an inclined manner such that as the inclined surface is farther from the axis of rotation, the inclined surface becomes farther from the predetermined surface.

3 Claims, 16 Drawing Sheets

ELECTRONIC DEVICE

BACKGROUND

1. Technical Field

This disclosure relates to an electronic device having a lid capable of opening or closing an opening of a case.

2. Related Art

JP-A-2013-175379 discloses an electronic device which includes a case provided with an opening, and a lid capable of taking an open state where the opening is exposed and a closed state where the opening is not exposed.

SUMMARY

In general, a case and a lid are held in a closed state by making engaging portions mounted on the case and the lid respectively engage with each other. There may be a case where the lid is configured by an outer lid and an inner lid. In such a configuration, when a user makes an error with respect to the order of opening or closing the lids or the like, there may be a case where the engaging portion of the case and the engaging portion of the lid are brought into contact with each other and hence, the lid or the case is broken.

It is an object of this disclosure to suppress breakage of a case or a lid in an electronic device provided with a lid which includes an outer lid and an inner lid.

The electronic device of this disclosure is an electronic device which includes:

a case having an opening on a predetermined surface; and a lid which is capable of taking an open state where the opening is exposed and a closed state where the opening is not exposed.

The lid includes an inner lid and an outer lid.

The inner lid includes:

an inner lid body portion disposed approximately parallel to the predetermined surface when the lid is in a closed state; and a hinge portion which connects the inner lid body portion to the case such that the inner lid body portion is rotatable about an axis of rotation parallel to the predetermined surface.

The outer lid includes:

an outer lid body portion held by the inner lid body portion in a slidably movable manner in the direction orthogonal to the axis of rotation;

a lid-side engaging portion formed on an end portion of the outer lid body portion away from the axis of rotation; and a projection which is formed on an end portion of the outer lid body portion closer to the axis of rotation, and projects toward the axis of rotation.

The case has a case-side engaging portion which is engageable with a lid-side engaging portion in a closed state on the predetermined surface thereof.

The outer lid is slidably movable in the direction orthogonal to the axis of rotation between a locked position where the lid-side engaging portion and the case-side engaging portion are brought into contact with each other at the time of rotation and an unlocked position where a contact between the lid-side engaging portion and the case-side engaging portion at the time of rotation is alleviated.

The case has a wall portion formed at a position facing a lower end side of the predetermined surface in a state where a gap is formed between the wall portion and the predetermined surface.

When the lid is in a first predetermined state where the lid is in a closed state and the outer lid is at the locked position, the projection of the outer lid is inserted into the gap.

When the lid is rotated in the closing direction toward the first predetermined state from a second predetermined state where the lid is in an open state and the outer lid at a locked position, the projection of the outer lid and a wall portion of the case are brought into contact with each other in the gap.

An inclined surface is formed on at least one of a portion, which is brought into contact with the wall portion of the case, of the projection of the outer lid and a portion, which is brought into contact with the projection of the outer lid, of the wall portion of the case, wherein the inclined surface is formed in an inclined manner such that as the inclined surface is farther from the axis of rotation, the inclined surface becomes farther from the predetermined surface.

In the electronic device of this disclosure, when the lid is rotated in the closing direction toward the first predetermined state from the second predetermined state where the lid is in an open state and the outer lid is at a locked position, the inclined surface of the projection of the outer lid and the inclined surface of the wall portion of the case are brought into contact with each other in the gap. In this case, the inclined surface is formed in an inclined manner such that as the inclined surface is farther from the axis of rotation, the inclined surface becomes farther from the predetermined surface of the case. Further, the hinge portion biases the inner lid body portion in the opening direction. Accordingly, when the inclined surface of the projection of the outer lid is brought into contact with the inclined surface of the wall portion of the case, the projection of the outer lid is pushed to the inclined surface of the wall portion of the case due to a biasing force of the hinge portion. At this point of time, a component of the biasing force which intends to move the projection of the outer lid toward a front side as well as toward an upper side along the inclined surface acts on the projection of the outer lid. This component of the biasing force acts as a force which intends to slidably move the outer lid upward with respect to the inner lid. Accordingly, the outer lid is moved toward a rear side and upwardly along the inclined surface. As a result, the outer lid is shifted to an unlocked position. Therefore, it is possible to prevent the collision between the lid-side engaging portion and the case-side engaging portion in advance. Accordingly, in the electronic device provided with the lid which has the outer lid and the inner lid, breakage of the case or the lid can be suppressed.

DETAILED DESCRIPTION

Hereinafter, an exemplary embodiment is described in detail with reference to attached drawings. However, descriptions with more detail than necessary may be omitted. For example, the detailed description with respect to matters which have been already well-known and the repeated description with respect to the substantially same structures may be omitted. This is to avoid the following descriptions from being unnecessarily redundant and to allow those skilled in the art to easily understand this disclosure.

The present inventors provide the accompanying drawings and the following descriptions to allow those skilled in the art to sufficiently understand this disclosure, and the subject defined in the claims is not intended to be restricted by the accompanying drawings and the following descriptions.

(First Embodiment)

[1. Configuration]

The configuration of an electronic device of a first embodiment is described.

[1-1. Overall Configuration]

Figure 1:
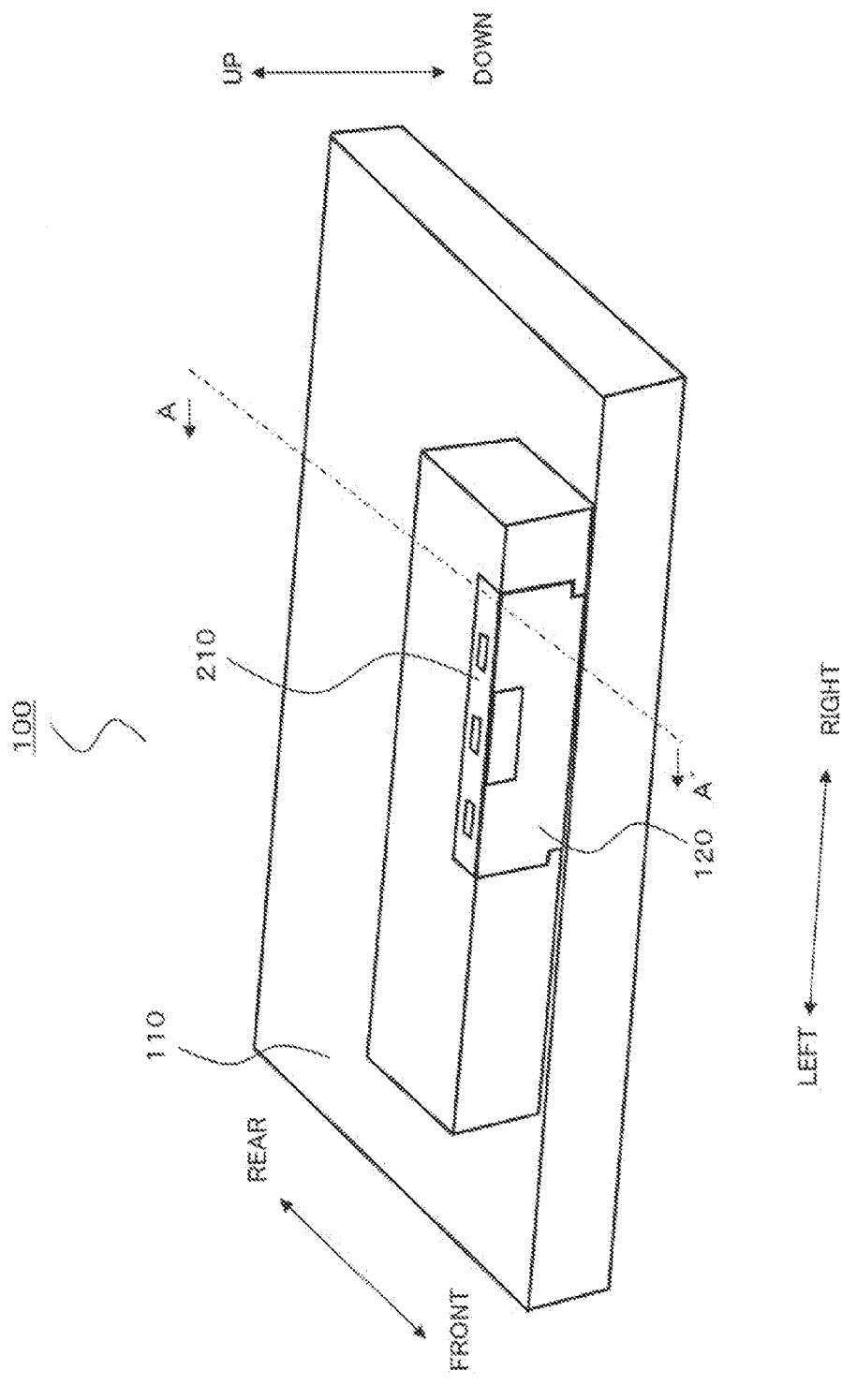
FIG. 1 is a perspective view showing an external appearance of an electronic device of an embodiment.

FIG. 1 is a perspective view showing an external appearance of an electronic device of this embodiment. FIG. 1 shows an electronic device 100 of this embodiment in a state where a back surface side of the electronic device 100 is facing up. In the description made hereinafter, as shown in FIG. 1, one side in the width direction (the lateral direction in FIG. 1) of the electronic device 100 is referred to as a left side (left) of the electronic device 100, and the other side in the width direction of the electronic device 100 is referred to as a right side (right) of the electronic device 100. A side in the depth direction of the electronic device 100 on which a lid 120 is provided is referred to as a front side (front) of the electronic device 100, and a side in the depth direction of the electronic device 100 on which the lid 120 is not provided is referred to as a rear side (rear). A back surface side of the electronic device 100 in the thickness direction of the electronic device 100 is referred to as an upper side (up), and a front surface side of the electronic device 100 in the thickness direction of the electronic device 100 is referred to as a lower side (down).

In this embodiment, the electronic device 100 is a tablet computer. The electronic device 100 includes a case 110 and electronic parts which are housed in the inside of the case 110. FIG. 1 shows the tablet computer with a back surface of the tablet computer facing up. The tablet computer merely constitutes one example to which an electronic device of this disclosure is applicable. The electronic device of this disclosure is broadly applicable to a device having a lid such as smartphones, laptop computers, portable audio players, television receiving apparatus, refrigerators or air conditioners in addition to the tablet computers.

As shown in FIG. 1, the lid 120 is disposed at a front portion of the case 110. The lid 120 is rotatable about a lower end side of the lid 120 between a full closed position (hereinafter referred to as "closed position" (a position shown in FIG. 1 and FIG. 3 described later)) where an opening formed in the case 110 is not exposed and a full open position (a position where the whole opening can be observed from a front surface of the case 110) where the opening formed in the case 110 is exposed. Positions other than the closed position including the full open position are referred to as an open position. A state where the lid 120 is at the closed position is referred to as "closed state", and a state where the lid 120 is at the open position is referred to as "open state".

Figure 2:
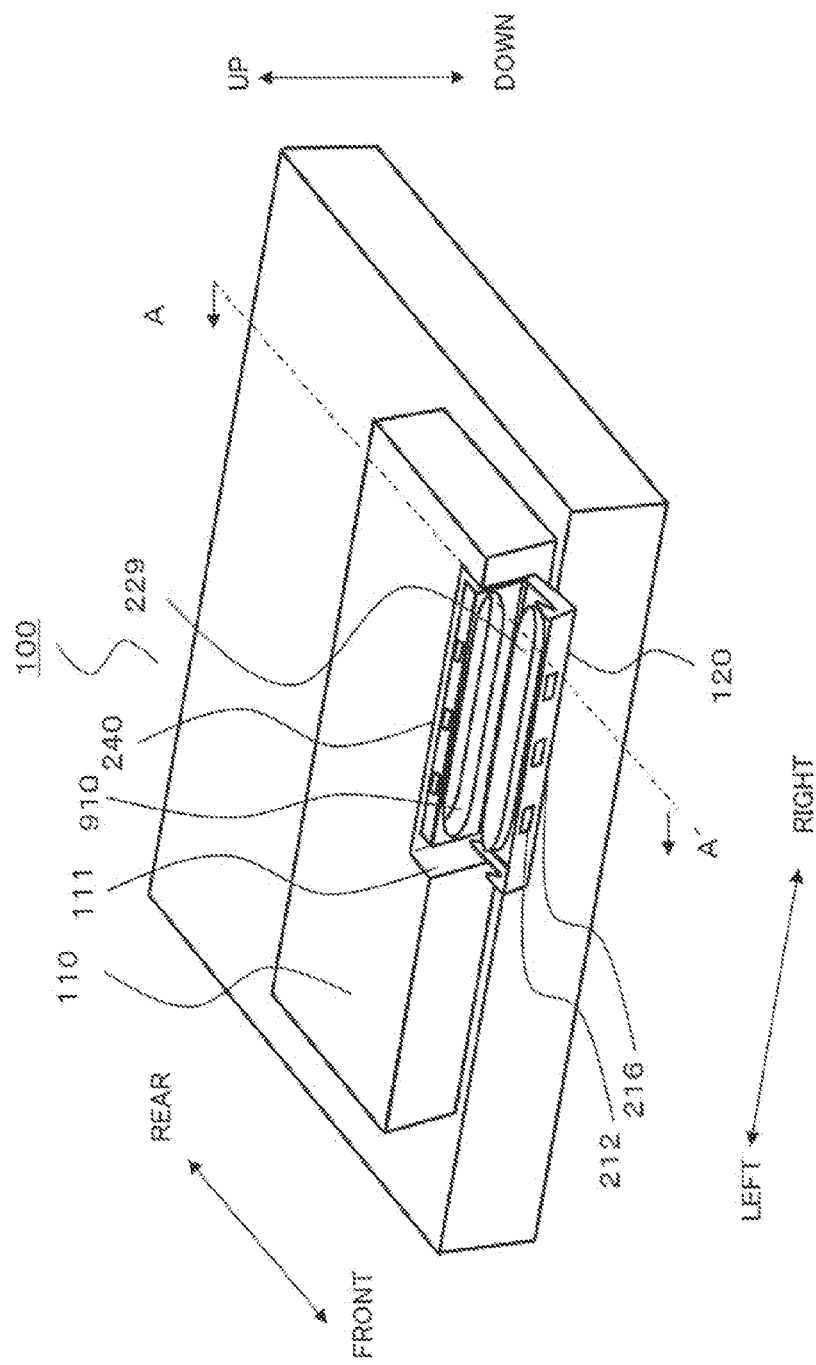
FIG. 2 is a perspective view showing an external appearance of the electronic device according to the embodiment in a state where a lid is in an open state.

FIG. 2 is a perspective view showing an external appearance of the electronic device according to this embodiment in a state where the lid is in an open state.

As shown in FIG. 2, a recessed portion 111 is formed on a front surface of the case 110. An opening 910 is formed on a bottom surface 111a (front surface) of the recessed portion 111. The lid 120 opens or closes the opening 910. An electronic part such as a card type recording media can be inserted into the opening 910. In the inside of the opening 910, a contact or the like is disposed which is brought into contact with a contact of the electronic part such as the card type recording media when the electronic part such as the card type recording media is inserted into the opening 910. The opening 910 is sealed by a cap 229 when the lid 120 is in a closed state shown in FIG. 1.

[1-2. Structure of Lid]

Figure 3:
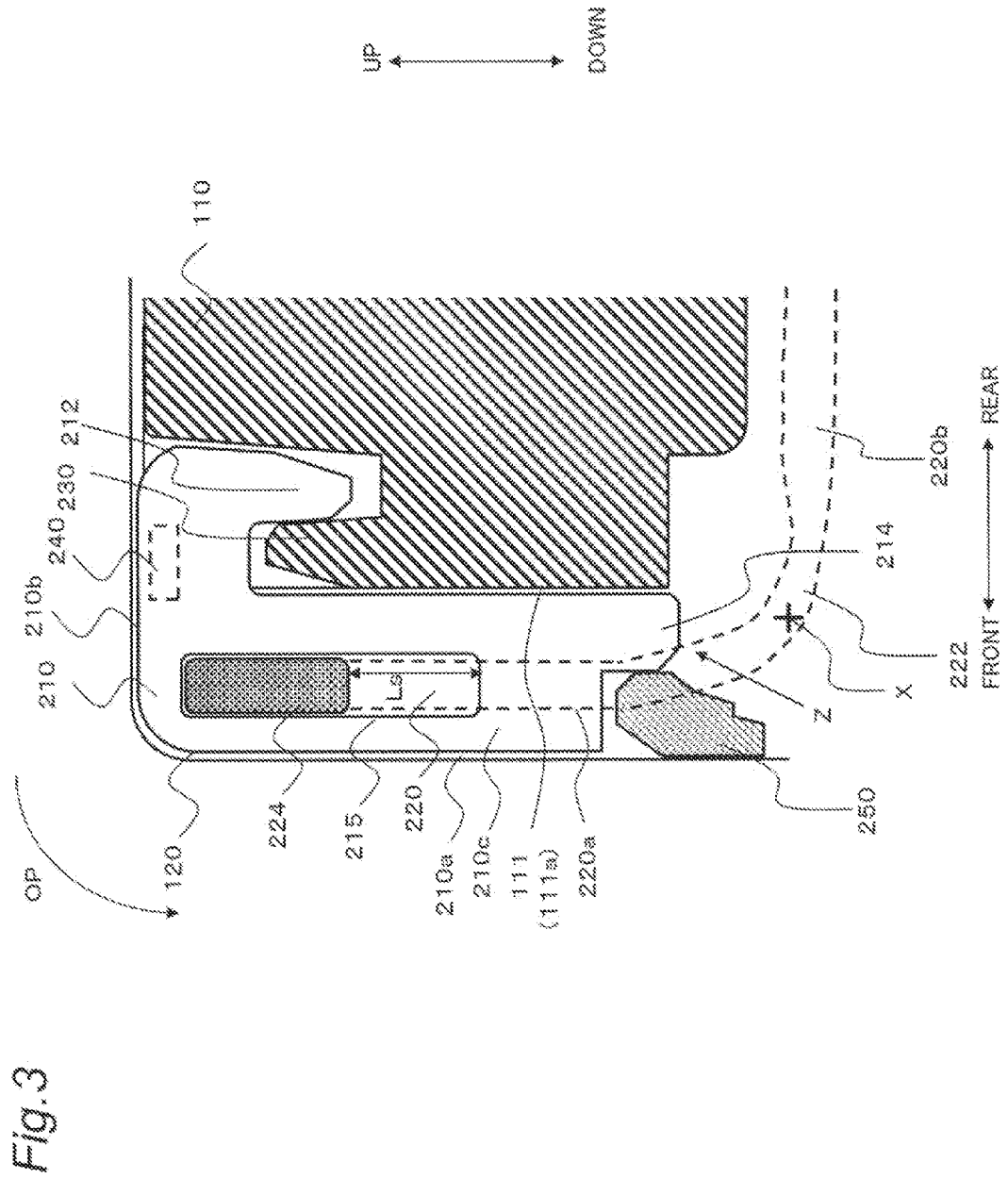
FIG. 3 is a cross-sectional view of the lid and an area around the lid of the electronic device of the embodiment in a state where the lid is in a closed state.

The structure of the lid 120 is described. FIG. 3 is a cross-sectional view of the lid and an area around the lid of the electronic device of this embodiment in a state where the lid is in a closed state. FIG. 3 is a cross-sectional view taken along line A-A' in FIG. 1.

As shown in FIG. 3, the lid 120 includes an outer lid 210 and an inner lid 220. The outer lid 210 and the inner lid 220 are made of a resin, for example.

[1-2-1. Outer Lid]

Figure 4:
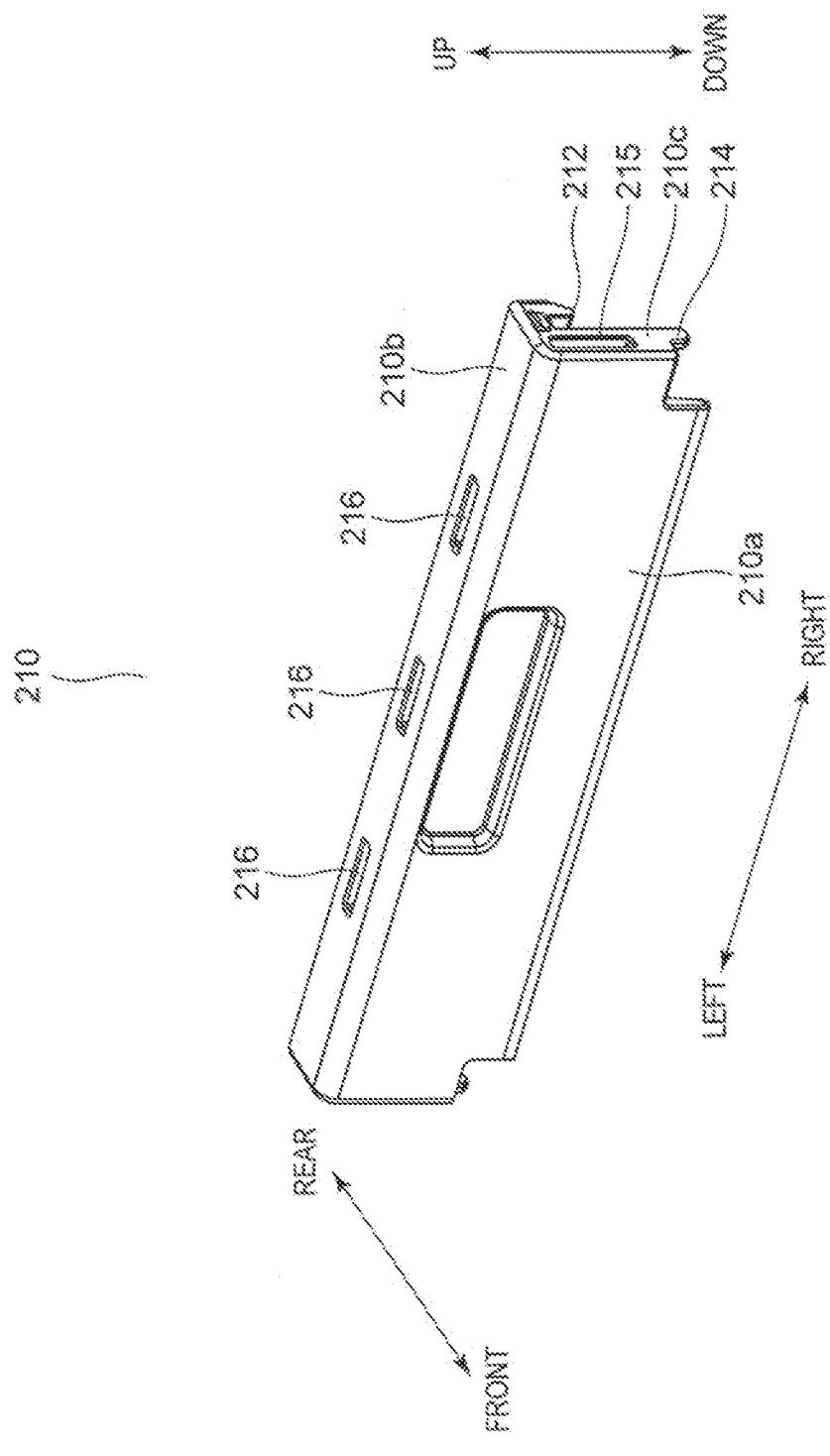
FIG. 4 is a perspective view showing an external appearance (front surface side (front side)) of an outer lid of the embodiment.
Figure 5:
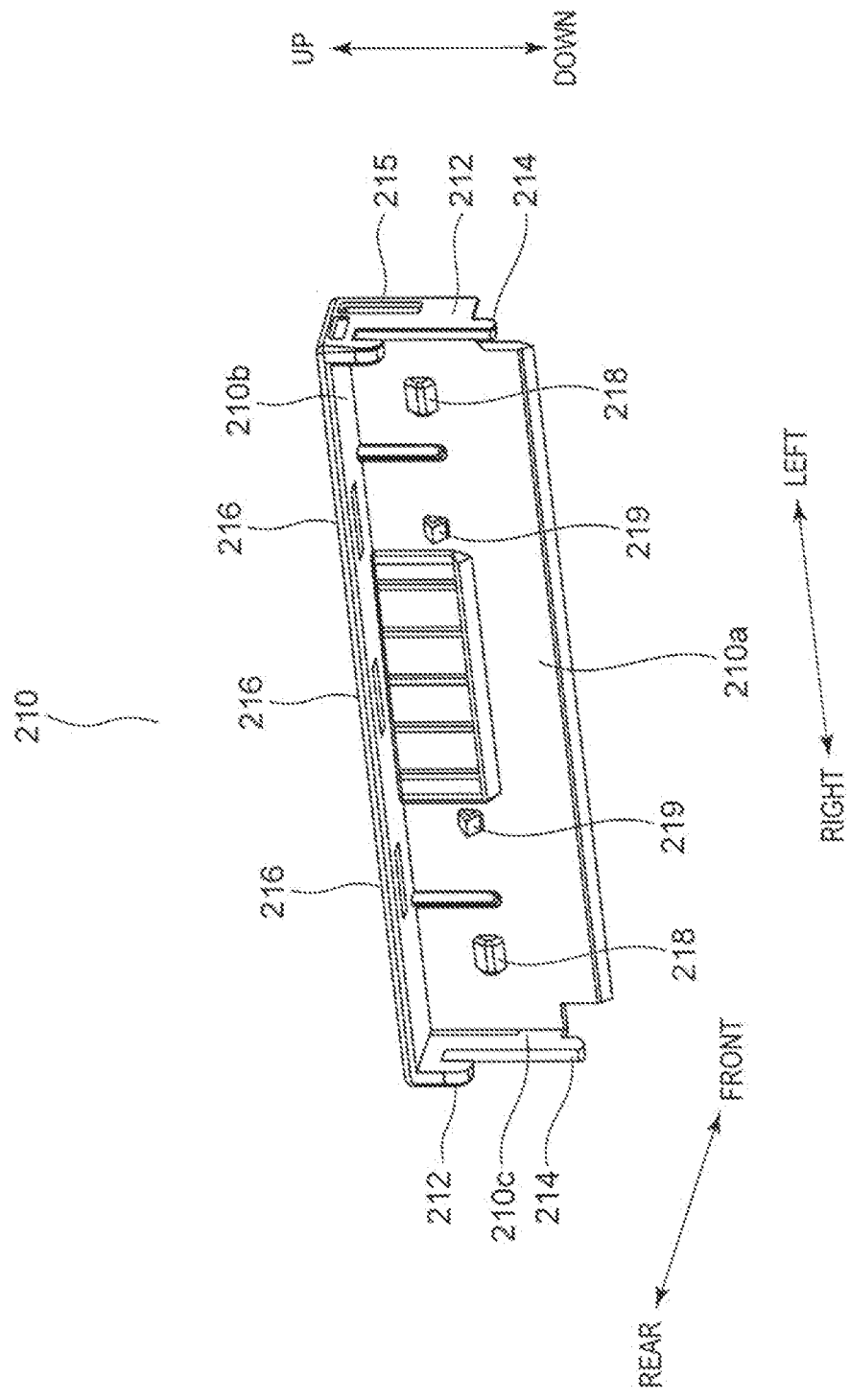
FIG. 5 is a perspective view showing the external appearance (rear surface side (rear side)) of the outer lid of the embodiment.

FIG. 4 is a perspective view showing an external appearance (front surface side (front side)) of the outer lid of this embodiment. FIG. 5 is a perspective view showing the external appearance (rear surface side (rear side)) of the outer lid of this embodiment. As shown in FIG. 3, FIG. 4 and FIG. 5, the outer lid 210 includes: a vertical wall portion 210a; an upper wall portion 210b; left and right side wall portions 210c; first lid-side engaging portions 212; and protective portions 214.

The first lid-side engaging portion 212 is formed at an end portion of an outer lid body portion (the vertical wall portion 210a and the side wall portions 210c) of the outer lid 210 on a side away from an axis of rotation X of a hinge portion 222 described later of the inner lid 220. More specifically, the first lid-side engaging portion 212 is a pawl formed on a rear side of the upper wall portion 210b of the outer lid 210 so as to extend downwardly. First case-side engaging portions 230 are formed on a front surface of the recessed portion 111 formed on the case 110. The first case-side engaging portion 230 is a pawl formed on the front surface of the recessed portion 111 formed on the case 110 so as to extend downwardly. The first lid-side engaging portions 212 are engaged with the first case-side engaging portions 230 when the lid 120 is in the closed state. Due to such engagement, a state where the lid 120 is rotated in the direction indicated by an arrow OP thus being brought into an open state is prevented.

The protective portion 214 is a projection formed on an end portion of the inner lid 220 on a side close to the axis of rotation X of the hinge portion 222 described later. The protective portion 214 is positioned at the substantially rotational center when the outer lid 210 is rotated in a state where the protective portions 214 are inserted into gaps Z described later formed in the case 110.

[1-2-2. Inner Lid]

Figure 6:
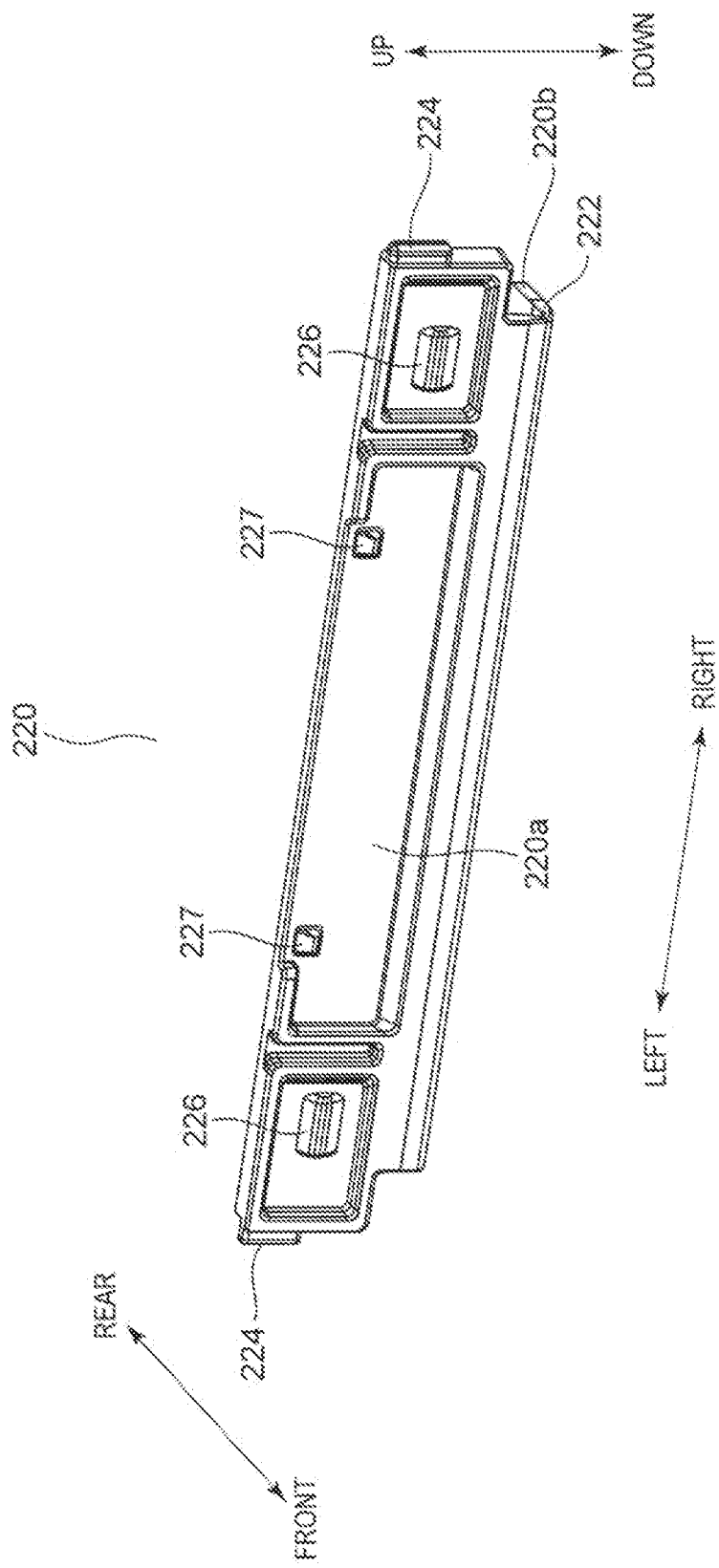
FIG. 6 is a perspective view showing an external appearance (front surface side (front side)) of an inner lid of the embodiment.
Figure 7:
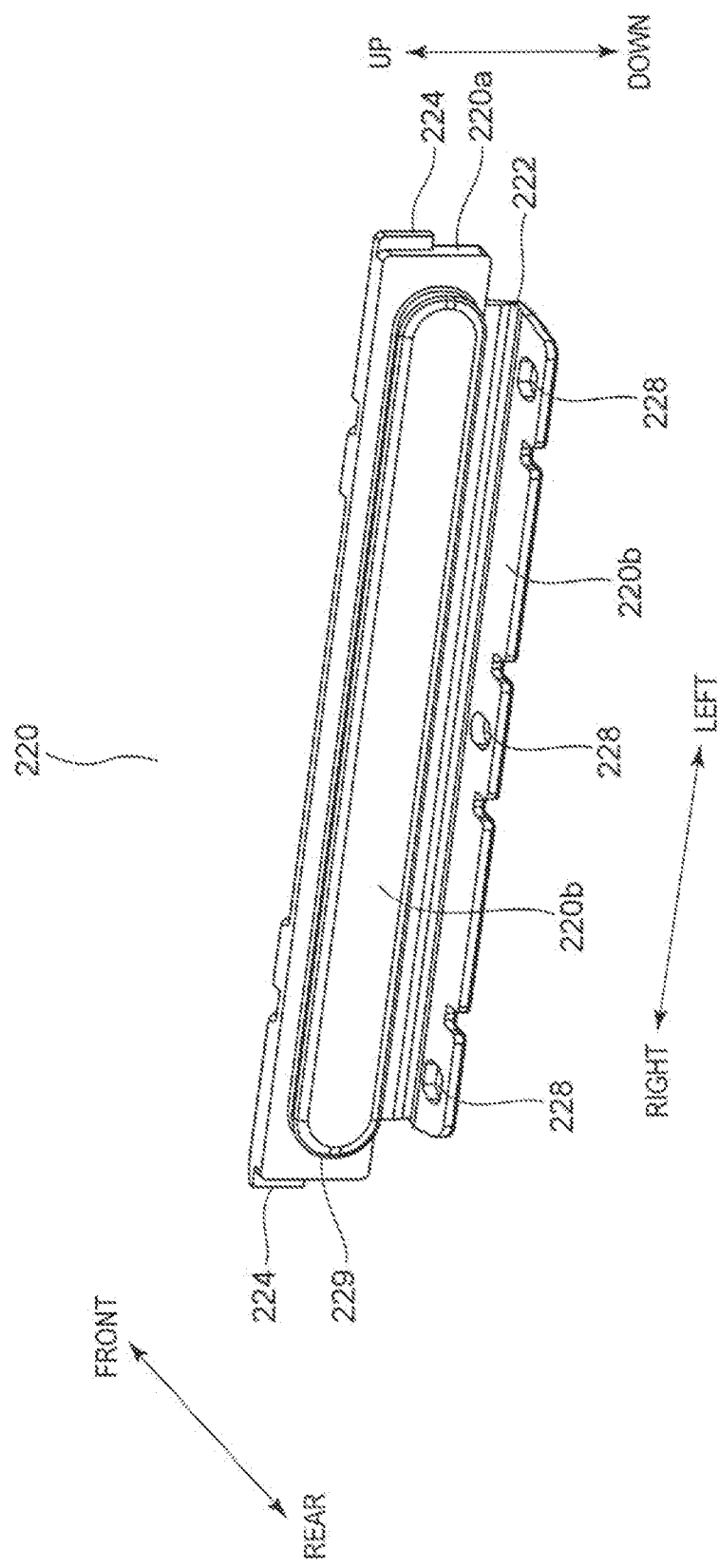
FIG. 7 is a perspective view showing the external appearance (rear surface side (rear side)) of the inner lid of the embodiment.

FIG. 6 is a perspective view showing an external appearance (front surface side (front side)) of the inner lid of this embodiment. FIG. 7 is a perspective view showing the external appearance (rear surface side (rear side)) of the inner lid of this embodiment. As shown in FIG. 3, FIG. 6 and FIG. 7, the inner lid 220 includes: a vertical wall portion 220a; a lateral wall portion 220b; a hinge portion 222; and latches 224.

The hinge portion 222 is a portion having a fixed length between the vertical wall portion 220a and the lateral wall portion 220b, and connects the vertical wall portion 220a and the lateral wall portion 220b with each other. The hinge portion 222 has a smaller wall thickness compared with the vertical wall portion 220a and the lateral wall portion 220b for allowing the hinge portion 222 to be bent. Due to such a configuration, the inner lid 220 can be bent at the hinge portion 222. The lateral wall portion 220b is fixed to the inside of the case 110 by screws (not shown). When the hinge portion 222 is bent, the vertical wall portion 220a is rotated about the hinge portion 222. The imaginary center of such rotation is referred to as an axis of rotation X. The axis of rotation X extends in the direction orthogonal to the direction that the vertical wall portion 220a and the lateral wall portion 220b are connected with each other. The vertical wall portion 220a is disposed approximately parallel to the bottom surface 111a of the recessed portion 111 when the lid 120 is in a closed state.

In this embodiment, the hinge portions 222 are made of a resin so that the hinge portion 222 exhibits elasticity. Accordingly, when the hinge portion 222 is bent, the hinge portion 222 is curved, and generates a restoring force which intends to restore a state where the hinge portion 222 is not bent. Such a restoring force acts as a force which biases the vertical wall portion 220a in the direction where the lid 120 is opened. Although the hinge portion 222 is integrally formed with the inner lid 220 in this embodiment, as long as the above-mentioned action can be acquired, the hinge portion 222 may be formed of a member separate from the vertical wall portion 220a and the lateral wall portion 220b. Further, the known rotatable structure may be utilized as the separated member.

The latches 224 are projections which project in the left and right directions from left and right end portions of the vertical wall portion 220a of the inner lid 220. The latches 224 are inserted into elongated holes 215 formed in the side wall portions 210c of the outer lid 210. The elongated hole 215 is a through hole extending long in the vertical direction which is formed in the side wall portion 210c in a penetrating manner. Accordingly, a gap is formed between an upper end of the latch 224 and an upper edge of the elongated hole 215 in a state where the latch 224 is inserted into the elongated hole 215 formed in the outer lid 210. Due to the presence of such a gap, the outer lid 210 is slidable in the vertical direction with respect to the inner lid 220. A length of the gap in the vertical direction is set to a length that the engagement between the first lid-side engaging portions 212 of the outer lid 210 and the first case-side engaging portions 230 of the case 110 is released when the outer lid 210 is slid upwardly so as to open or close the lid 120.

[1-3. Case]

As shown in FIG. 3, the case 110 includes second case-side engaging portions 240 above the recessed portion 111. In the same manner as the first case-side engaging portion 230, the second case-side engaging portions 240 are in contact with the second lid-side engaging portions (described later) when the lid 120 is in a closed state. The contact between the second case-side engaging portions 240 and the second lid-side engaging portion prevents the lid 120 from being rotated in the direction indicated by an arrow OP. That is, the contact between the second case-side engaging portions 240 and the second lid-side engaging portion prevents the lid 120 from being brought into an open state. In other drawings, for facilitating the understanding of the drawings, the second case-side engaging portions 240 may be omitted.

The case 110 has guide portions 250 at positions in front of a lower end side of the bottom surface 111a of the recessed portion 111. The gap Z is formed between the case 110 and the bottom surface 111a, and the guide portions 250 are formed in the gap Z. In a state shown in FIG. 3, that is, in a first state (first predetermined state) where the lid 120 is in a closed state, and the outer lid 210 is at a locked position (described later), the protective portions 214 of the outer lid 210 are inserted into the gaps Z.

[1-4. Other Structures of Lid]

Other structures of the outer lid 210 and the inner lid 220 are described with reference to FIG. 4 to FIG. 7 and the like.

[1-4-1. Other Structures of Outer Lid]

As shown in FIG. 4, the first lid-side engaging portion 212 and the protective portion 214 are formed on the right side wall portion 210c of the outer lid 210. Although not shown in FIG. 4, the first lid-side engaging portion 212 and the protective portion 214 are also formed an the left side wall portion 210c of the outer lid 210 respectively. It is not essential that the first lid-side engaging portion 212 and the protective portion 214 are formed on both left and right side wall portions 210c of the outer lid 210. In the electronic device of this disclosure, the first lid-side engaging portion 212 and the protective portion 214 may be formed on either one of the left and right side wall portions 210c.

The outer lid 210 has second lid-side engaging portions 216. The second lid-side engaging portion 216 is an opening formed in the upper wall portion 210b of the outer lid 210. In this embodiment, three second lid-side engaging portions 216 are formed. In this disclosure, it is sufficient that at least one second lid-side engaging portion is formed. The second lid-side engaging portions 216 are engaged with the second case-side engaging portions 240 when the lid 120 is in an open state.

As shown in FIG. 5, outer lid-side projections 218, 219 are formed on a back surface (rear surface) of the vertical wall portion 210a of the outer lid 210.

The outer lid-side projections 218, 219 project rearwardly from the back surface (rear surface) of the vertical wall portion 210a of the outer lid 210. More specifically, the outer lid-side projections 218, 219 are formed of triangular projections. The triangular projection has an upwardly inclined surface and a downwardly inclined surface both of which are inclined at a predetermined angle with respect to the back surface of the vertical wall portion 210a when the electronic device is viewed in the width direction. When the outer lid-side projections 218, 219 are gently engaged (brought into contact) with inner lid-side projections 226, 227 described later (see FIG. 6), a position of the outer lid 210 with respect to the inner lid 220 is maintained. At the same time, click feeling is given to a user when the user performs a slide operation of the outer lid 210. Further, a state where the outer lid 210 is at an unlocked position is maintained. Accordingly, it is possible to prevent that a position of the outer lid 210 is changed from the unlocked position when the direction of the electronic device 100 is changed. Further, when the lid 120 is in an open state and the outer lid 120 is at an unlocked position, it is possible to prevent that the user erroneously or unconsciously moves the lid 120 to a locked position. Accordingly, it is possible to prevent the breakage of the case 110 and the breakage of the lid 120.

[1-4-2. Other Structures of Inner Lid]

As shown in FIG. 6, the inner lid-side projections 226, 227 are formed on a surface (front surface) of the vertical wall portion 220a of the inner lid 220. The inner lid-side projections 226, 227 are respectively formed of triangular projections. The triangular projection has an upwardly inclined surface and a downwardly inclined surface both of which are inclined at a predetermined angle with respect to the surface of the vertical wall portion 220a when the electronic device is viewed in the width direction. The inner lid-side projection 226 is formed at a position where the upwardly inclined surface of the inner lid-side projection 226 is brought into contact (engaged) with the downwardly inclined surface of the outer lid-side projection 218 when the lid 120 is in a closed state. Due to such a configuration, the inner lid-side projection 226 gently prevents the outer lid 210 from upwardly sliding with respect to the inner lid 220 when the lid 120 is in a closed state. When a predetermined force or more in the upward direction is applied to the outer lid 210, the engagement between the inner lid-side projection 226 and the outer lid-side projection 218 is released so that the outer lid 210 is brought into a slidable state. The inner lid-side projection 227 is formed at a position where the upwardly inclined surface of the inner lid-side projection 227 is brought into contact with the downwardly inclined surface of the outer lid-side projection 219 when the lid 120 is in a closed state. Due to such a configuration, the inner lid-side projection 227 prevents the downward sliding of the outer lid 210 after the outer lid 210 upwardly slides with respect to the inner lid-side projection 227 from a closed state.

As shown in FIG. 7, the inner lid 220 is bent to a rear side (to a viewer's side in FIG. 7) so as to form an approximately L shape using the hinge portion 222 as an axis.

Screw holes 228 are formed in the lateral wall portion 220b. Screws (not shown) for fixing the lateral wall portion 220b to the case 110 are inserted into the screw holes 228.

A cap 229 is formed of a projecting portion which projects rearwardly from a back surface (rear surface) of the vertical wall portion 220a of the inner lid 220. The cap 229 seals the opening 910 formed in the case 110.

[2. The Manner of Operation of Opening/Closing Lid]
[2-1. Unlocked Position]

Figure 8:
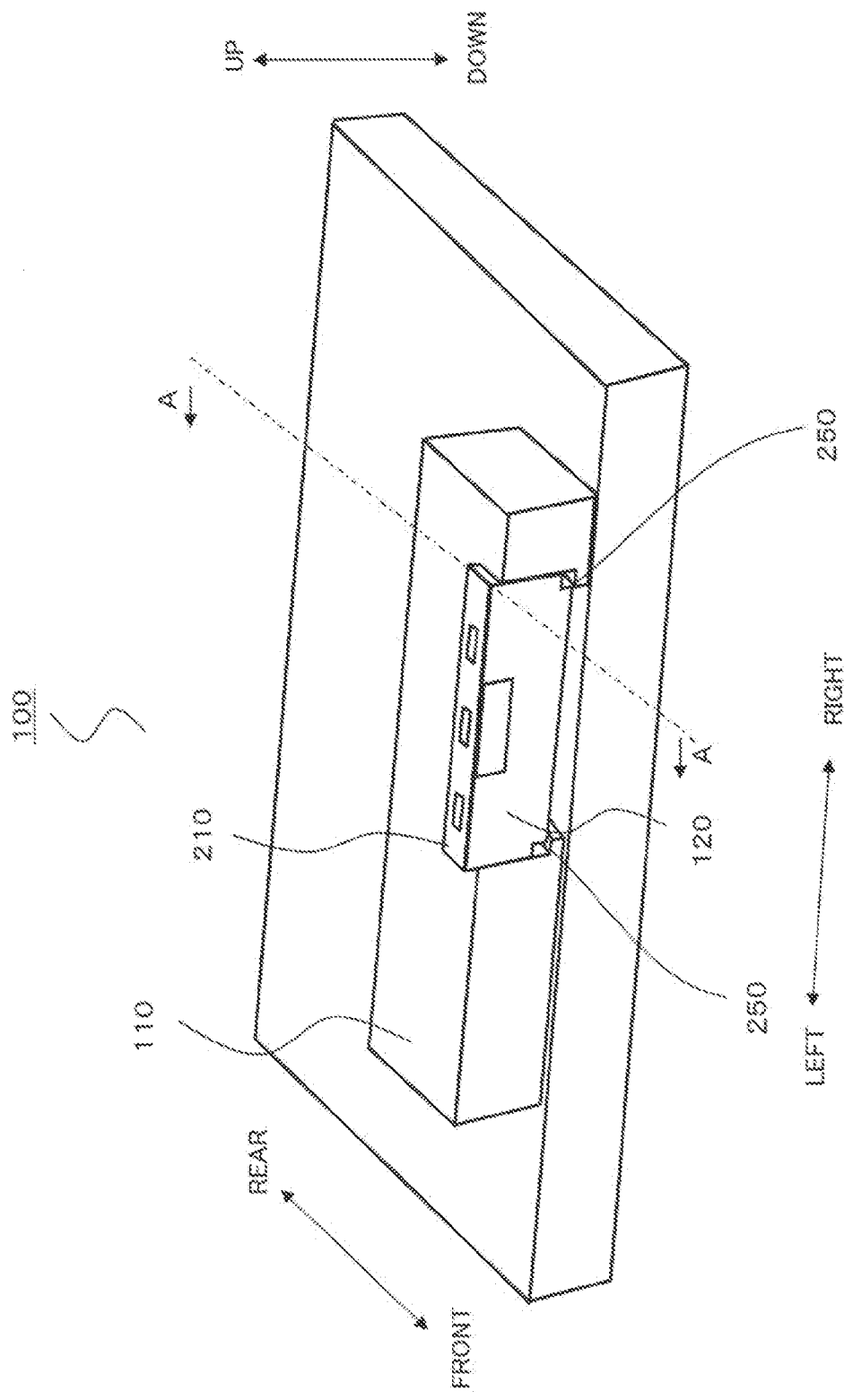
FIG. 8 is a perspective view showing an external appearance of the electronic device of the embodiment in a state where the outer lid is at an unlocked position.

The outer lid 210 is supported by the vertical wall portion 220a of the inner lid 220 in a slidable manner in the direction orthogonal to the axis of rotation X between a locked position and an unlocked position. When the outer lid 210 is at the locked position, the first lid-side engaging portions 212 and the first case-side engaging portions 230 are in contact with each other at the time of rotation of the outer lid 210. When the outer lid 210 is at the unlocked position, the contact between the first lid-side engaging portions 212 and the first case-side engaging portions 230 at the time of rotation of the outer lid 210 is alleviated. The lid 120 shifts to an open state shown in FIG. 2 from a closed state shown in FIG. 1 through a state where the outer lid is at an unlocked position shown in FIG. 8. FIG. 8 is a perspective view showing an external appearance of the electronic device of this embodiment in a state where the outer lid is at an unlocked position. As can be understood when FIG. 8 is compared with FIG. 1, the outer lid 210 of the lid 120 is upwardly slidable in the thickness direction of the case 110.

Figure 9:
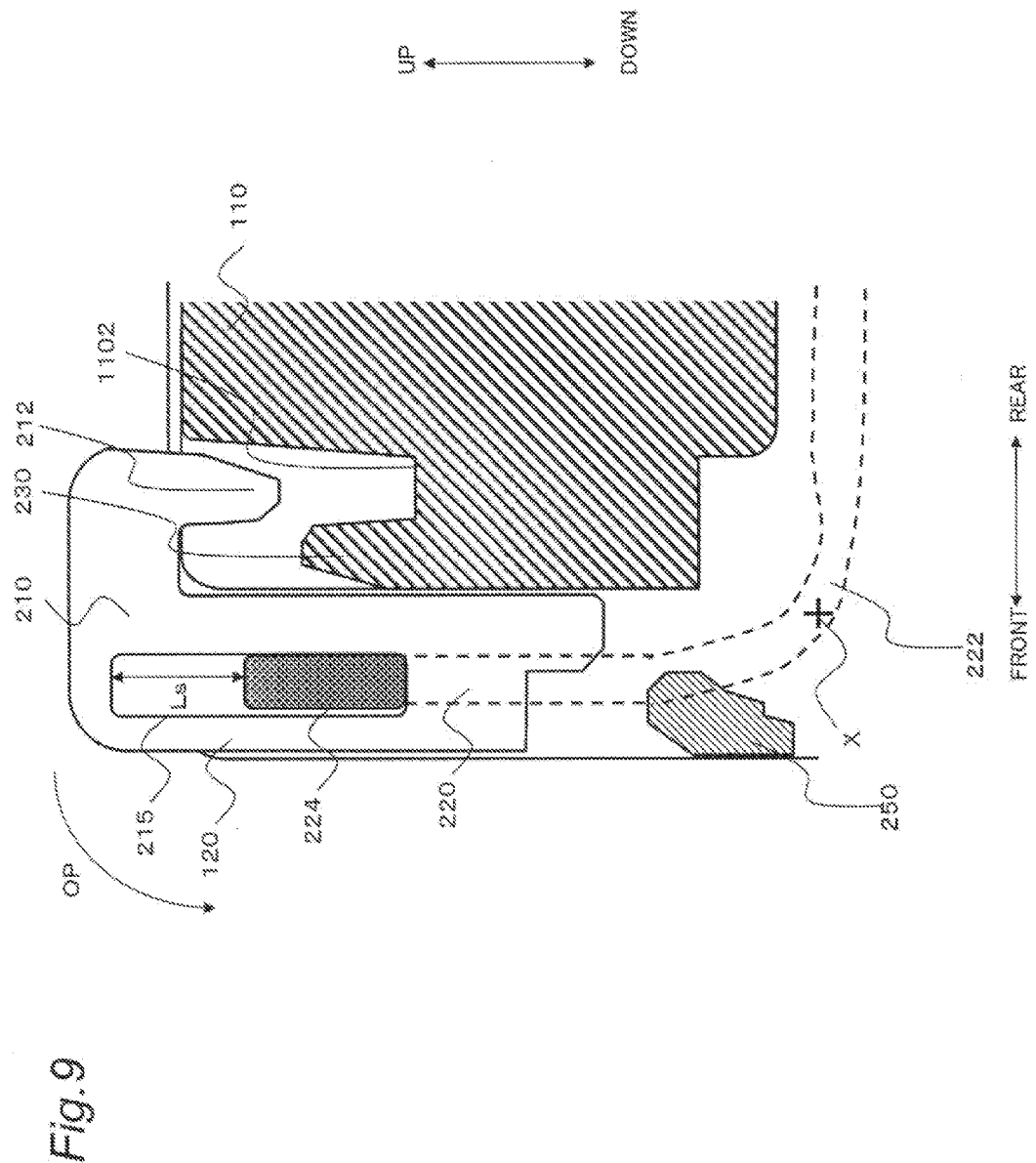
FIG. 9 is a cross-sectional view of the lid and the area around the lid of the electronic device of the embodiment in a state where the outer lid is at the unlocked position.

FIG. 9 is a cross-sectional view of the lid and the area around the lid of the electronic device of this embodiment in a state where the outer lid is at an unlocked position. As can be understood when FIG. 9 is compared with FIG. 3, the outer lid 210 is slid upwardly with respect to the inner lid 220 when the outer lid is at an unlocked position. The outer lid 210 is held by the inner lid 220 due to the latches 224 and the above-mentioned contact between the outer lid-side projections 218, 219 and the inner lid-side projections 226, 227. When a force in the upward direction is applied to the outer lid 210 in a state where the lid 210 is in a closed state shown in FIG. 2, the meshing between the outer lid-side projections 218, 219 and the inner lid-side projections 226, 227 is released. As a result, the outer lid 210 is slid with respect to the inner lid 220 by an amount corresponding to a gap Ls formed between the latch 224 and the elongated hole 215 formed in the outer lid 210 thus being moved to an unlocked position shown in FIG. 9.

As shown in FIG. 9, when the outer lid is at an unlocked position, the first lid-side engaging portions 212 and the first case-side engaging portions 230 are not engaged (in contact) with each other. Accordingly, the lid 120 is rotatable in the direction indicated by an arrow OP using the hinge portion 222 as an axis. In this disclosure, "unlocked position" means a relative position of the outer lid 210 with respect to the inner lid 220, and is a position where the degree of restriction of the rotation of the lid 120 to an open state is weakened compared to a case where the rotation of the lid 120 to an open state is restricted by a contact between the first lid-side engaging portions 212 and the first case-side engaging portions 230. That is, "unlocked position" also includes a position of the outer lid 210 with respect to the inner lid 220 where distal ends of the first lid-side engaging portions 212 and distal ends of the first case-side engaging portions 230 are slightly in contact with each other. The reason such a position is also included in "unlocked position" is that the lid 120 can be easily brought into an open state when the user manipulates the lid 120.

[2-2. Open State]

Figure 10:
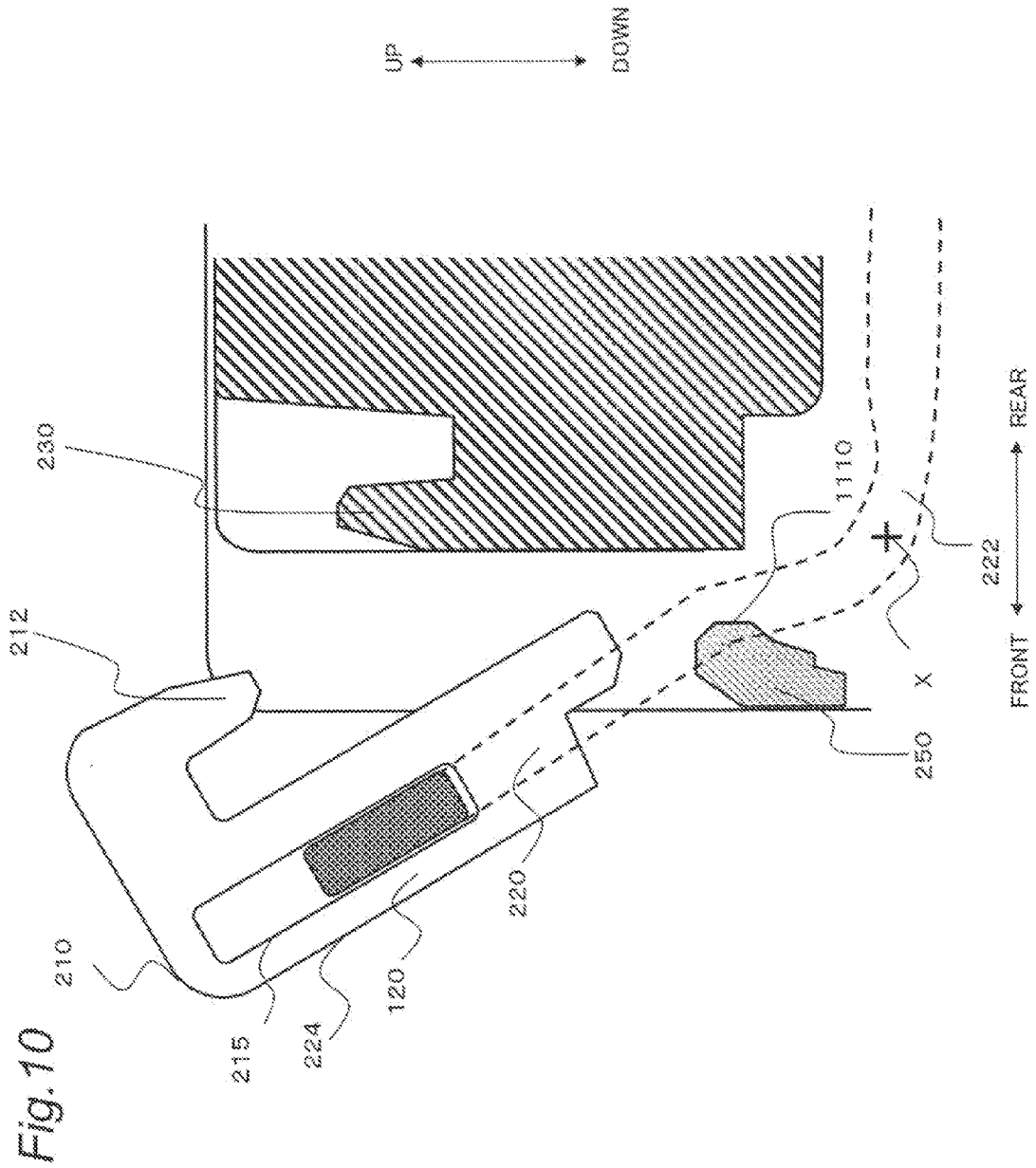
FIG. 10 is a cross-sectional view of the lid and the area around the lid of the electronic device of the embodiment in a state where the lid is in an open state.

When the lid 120 is in an open state shown in FIG. 2, the engagement between the second case-side engaging portions 240 and the second lid-side engaging portions 216 is released as shown in FIG. 10. For example, as shown in FIG. 8 and FIG. 9, the engagement between the second case-side engaging portions 240 and the second lid-side engaging portions 216 is released when the outer lid 210 is moved to an unlocked position.

FIG. 10 is a cross-sectional view of the lid and the area around the lid of the electronic device of this embodiment in a state where the lid is in an open state. FIG. 10 is a cross-sectional view taken along line A-A' in FIG. 8. In FIG. 10, an opening/closing angle of the lid 120 is closer to an angle where the lid 120 is in a closed state than an opening/closing angle of the lid 120 in a state shown in FIG. 2.

As shown in FIG. 10, when a contact (engagement) between the first lid-side engaging portions 212 and the first case-side engaging portions 230 is eliminated, the lid 120 is rotated to an open state due to an own weight of the lid 120.

Figure 11:
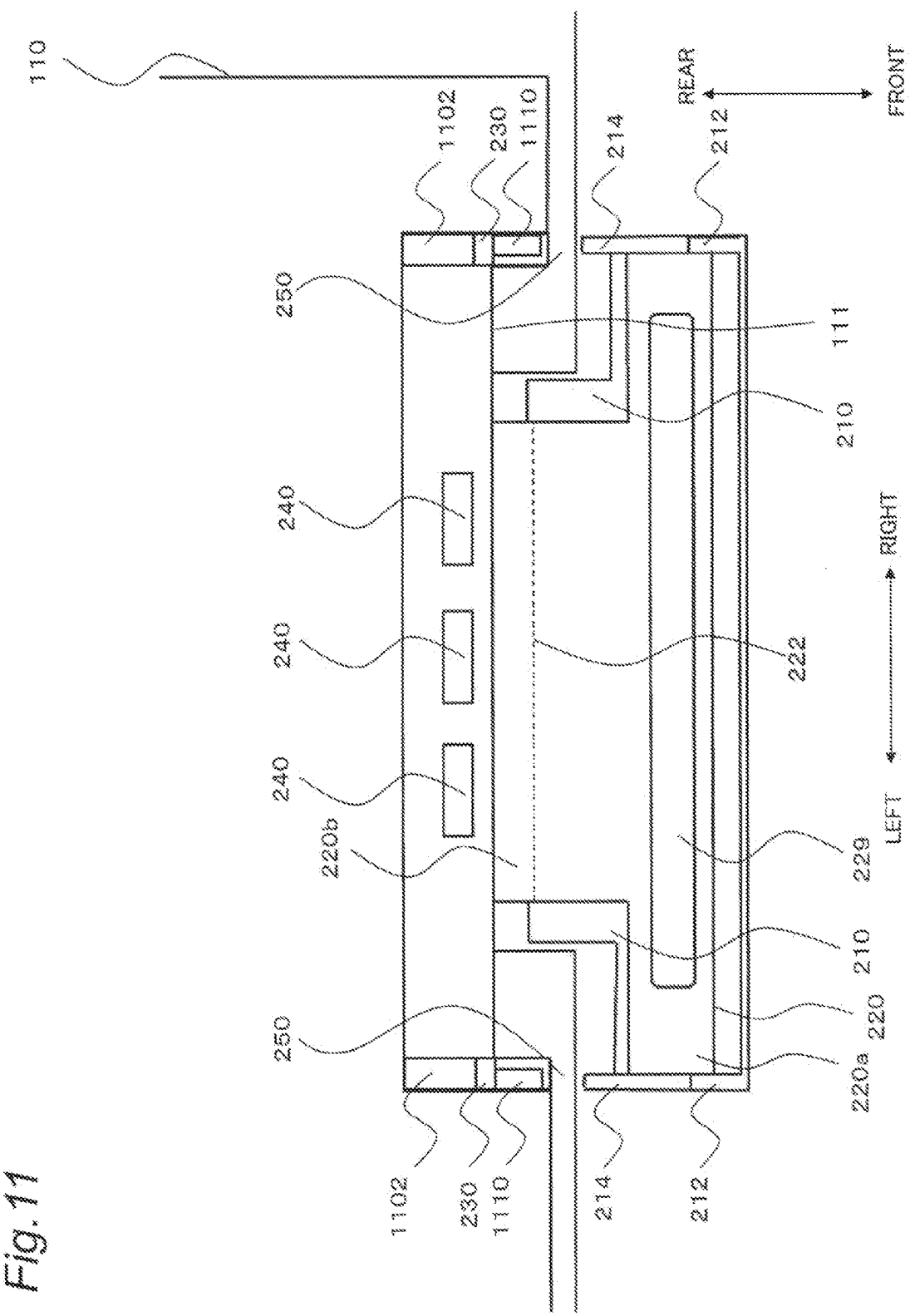
FIG. 11 is a top plan view of the lid and the area around the lid of the electronic device of the embodiment in a state where the lid is in the open state.

FIG. 11 is a top plan view of the lid and the area around the lid of the electronic device of this embodiment in a state where the lid is in an open state. The lid 120 and the case 110 have the substantially left-and-right symmetrical structure.

As shown in FIG. 11, the case 110 has recesses 1102 (see FIG. 10) and the first case-side engaging portions 230 on wall portions of the case 110 around the opening 910 (not shown in FIG. 11) formed on the recessed portion 111. The recesses 1102 are portions into which the first lid-side engaging portions 212 are inserted.

Insertion ports 1110 (see FIG. 10) are formed between the first case-side engaging portions 230 and the guide portions 250. The insertion ports 1110 are portions into which the protective portions 214 are inserted when the outer lid 210 is closed.

[2-3. State that Lid can Take]

As described above, the lid 120 of the electronic device 100 of this disclosure can take four kinds of states, i.e., first to fourth states. That is, the outer lid 210 is slid with respect to the inner lid 220 so that the outer lid 210 may take two kinds of states, i.e., a state where the outer lid 210 is at a locked position and a state where the outer lid 210 is at an unlocked position. Further, the vertical wall portion 220a of the inner lid 220 is rotated using the hinge portion 222 as an axis so that the lid 120 may take two kinds of states, i.e., an open state and a closed state. Accordingly, the lid 120 of the electronic device 100 of this disclosure may take four kinds of states which differ from each other in combination of a position of the outer lid 210 and a state of the lid 120.

As shown in FIG. 1 and FIG. 3, a first state (first predetermined state) is a state where the outer lid 210 is at a locked position and the lid 120 is in a closed state.

As shown in FIG. 8 and FIG. 9, a second state is a state where the outer lid 210 is at an unlocked position and the lid 120 is in a closed state.

As shown in FIG. 2 to FIG. 11, a third state is a state where the outer lid 210 is at an unlocked position and the lid 120 is in an open state.

Figure 12:
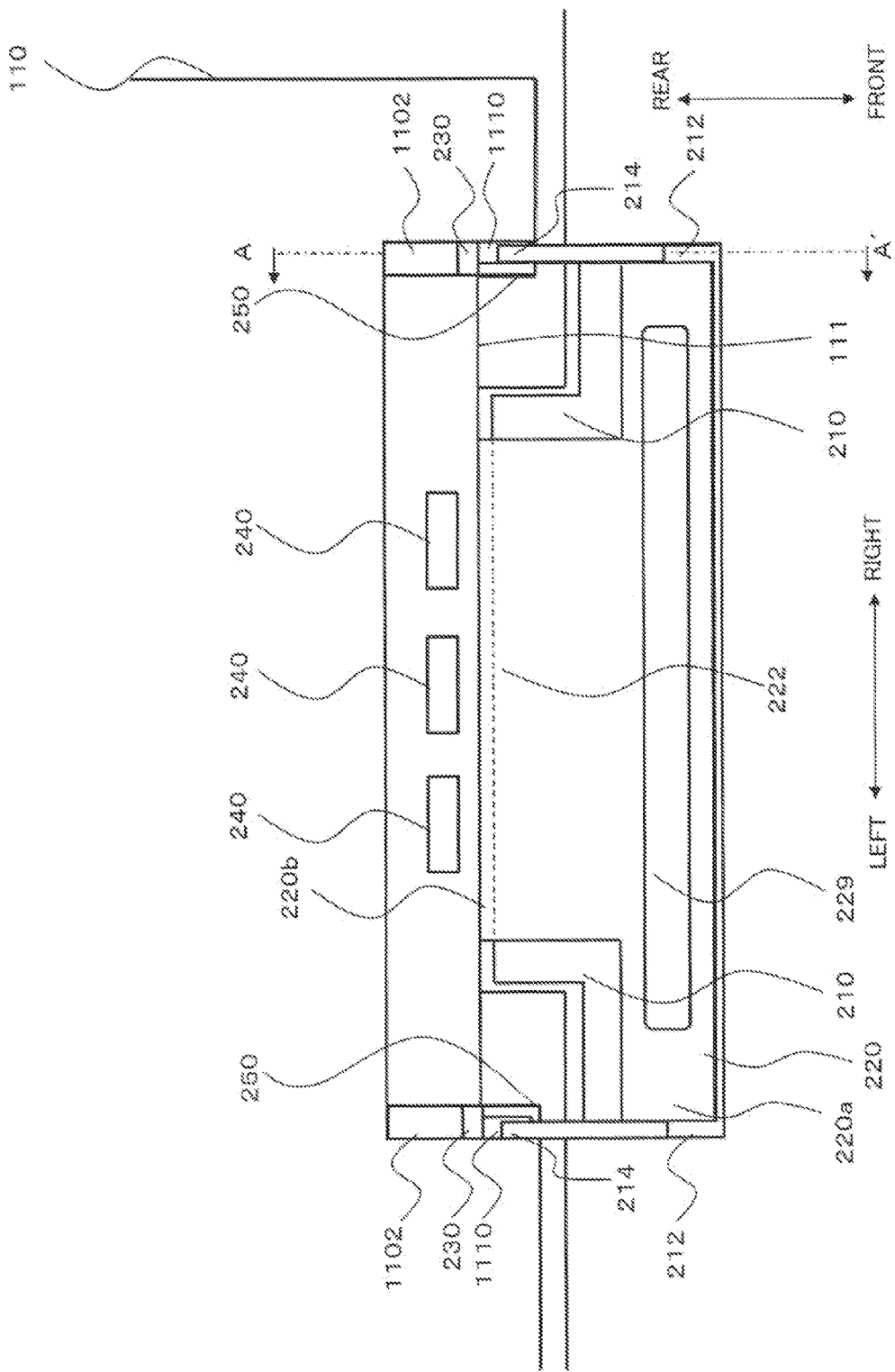
FIG. 12 is a top plan view of the lid and the area around the lid of the electronic device of the embodiment in a state where the electronic device is in a fourth state.

As shown in FIG. 12, a fourth state (second predetermined state) is a state where the outer lid 210 is at a locked position and the lid 120 is in an open state.

A user of the electronic device 100 usually changes a state of the electronic device 100 to only three kinds of states, that is, the first state, the second state or the third state out of the above-mentioned four kinds of states. This is because there is almost no necessity to bring the electronic device 100 into the fourth state where the outer lid 210 is at a locked position and the lid 120 is in an open state. Further, to bring the electronic device 100 into a state where the lid 120 is in an open state from a state where the lid 120 is in a closed state, it is inevitable to move the outer lid 210 to an unlocked position. Accordingly, when the lid 120 is in an open state, the outer lid 210 is usually at an unlocked position.

However, there exists a possibility that some external force acts on the lid 120 so that the outer lid 210 is moved to a locked position when the lid 120 is in an open state. For example, there may be a case where a user erroneously moves the outer lid 210 to a locked position.

[2-4. Problem]

A problem when the electronic device is in the fourth state and the configuration for solving the problem are described.

FIG. 12 is a top plan view of the lid and the area around the lid of the electronic device of the embodiment in a state where the electronic device is in the fourth state.

As can be understood when FIG. 12 is compared with FIG. 11, when the electronic device is in the fourth state, the outer lid 210 is positioned more on a case 110 side compared to a case where the electronic device is in the third state.

Figure 13:
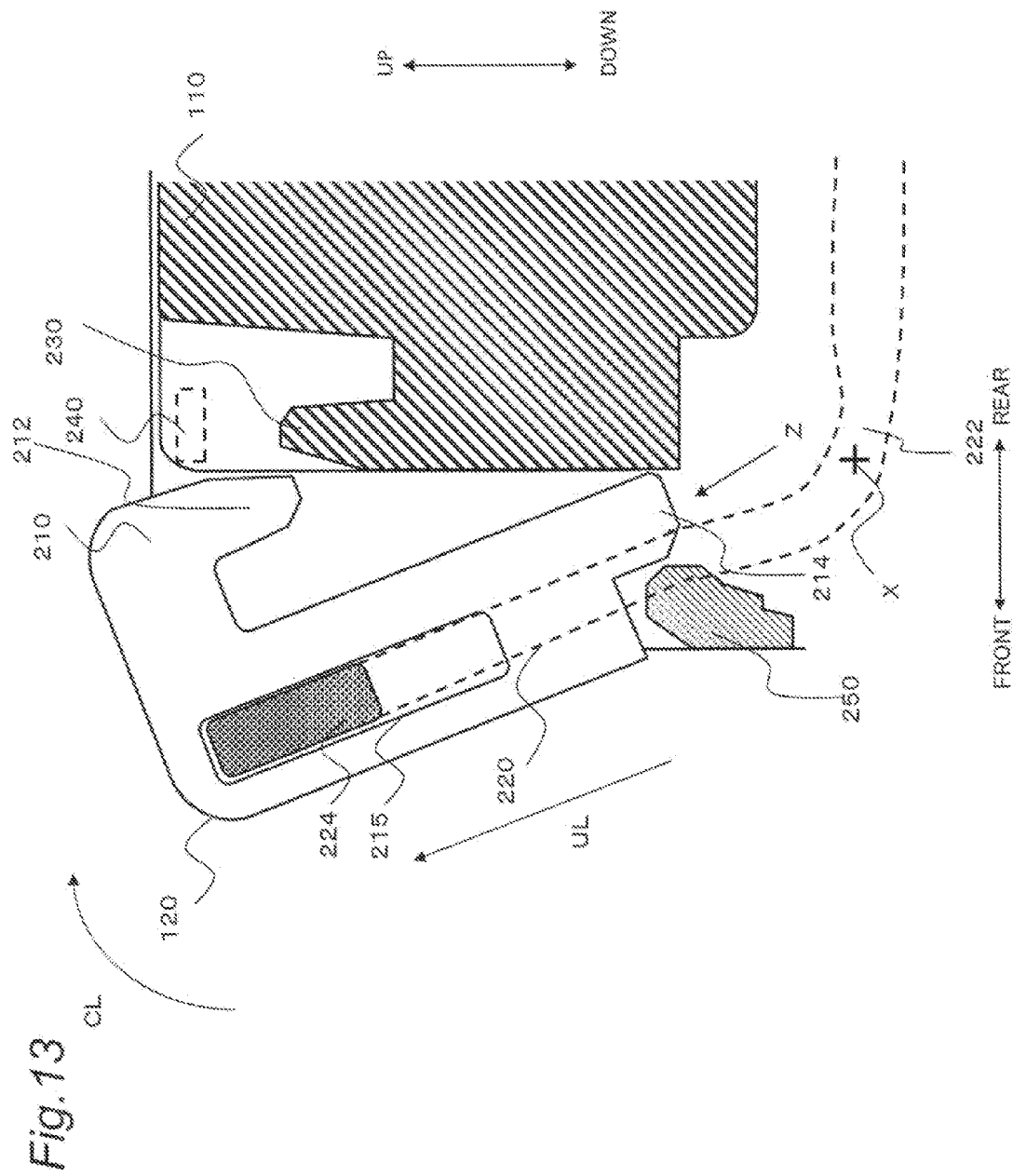
FIG. 13 is a cross-sectional view of the lid and the area around the lid of the electronic device of the embodiment in a state where the electronic device is in the fourth state.

FIG. 13 is a cross-sectional view of the lid and the area around the lid of the electronic device of the embodiment in a state where the electronic device is in the fourth state. FIG. 13 is a cross-sectional view taken along line A-A' in FIG. 12.

As shown in FIG. 13, when the electronic device is in the fourth state, distal ends of the first lid-side engaging portions 212 of the outer lid 210 are positioned below distal ends of the first case-side engaging portions 230 of the case 110 in the thickness direction (vertical direction) of the electronic device. This means that the first case-side engaging portions 230 are present on a rotation path of the first lid-side engaging portions 212. Assume that the lid 120 is rotated (that the lid 120 is rotated in the direction indicated by an arrow CL shown in FIG. 13) in such a state to take a closed state. In such a case, there exists a possibility that distal end sides of the first lid-side engaging portions 212 and distal end sides of the first case-side engaging portions 230 collide against each other.

When the first lid-side engaging portions 212 (the distal end sides of the first lid-side engaging portions 212) and the first case-side engaging portions 230 (the distal end side of the first case-side engaging portions 230) collide against each other, there exists a possibility that the first lid-side engaging portions 212 or the first case-side engaging portions 230 are broken.

[2-5. Characteristic of Electronic Device of this Disclosure]

To prevent the above-mentioned breakage, in this embodiment, the outer lid 210 is forcibly slid with respect to the inner lid 220 when the lid 120 is rotated to take a closed state. That is, the electronic device of this disclosure is configured such that the outer lid 210 is moved upwardly with respect to the case 110 so that a rotation path of the distal ends of the first lid-side engaging portions 212 of the outer lid 210 is moved above the distal ends of the first case-side engaging portions 230 of the case 110.

More specifically, the lid 120 and the case 110 are configured such that the protective portions 214 of the outer lid 210 and the guide portions 250 of the case 110 are brought into contact with each other in the gaps Z when the lid 120 is rotated in the closing direction from the fourth state (second predetermined state) where the lid 120 is in an open state and the outer lid 210 is at a locked position to the first state (first predetermined state) where the lid 120 is in a closed state and the outer lid 210 is in a locked position. Further, an inclined surface 214a is formed on portions of the protective portions 214 of the outer lid 210 which are brought into contact with the guide portions 250 of the case 110. An inclined surface 250a is formed on portions of the guide portions 250 of the case 110 which are brought into contact with the protective portions 214 of the outer lid 210. The inclined surface 214a, 250a is formed such that as the inclined surface 214a, 250a is farther from the axis of rotation X, the inclined surface 214a, 250a becomes farther from the bottom surface 111a. Further, the hinge portion 222 biases the vertical wall portion 220a in the opening direction as described above.

Figure 14:
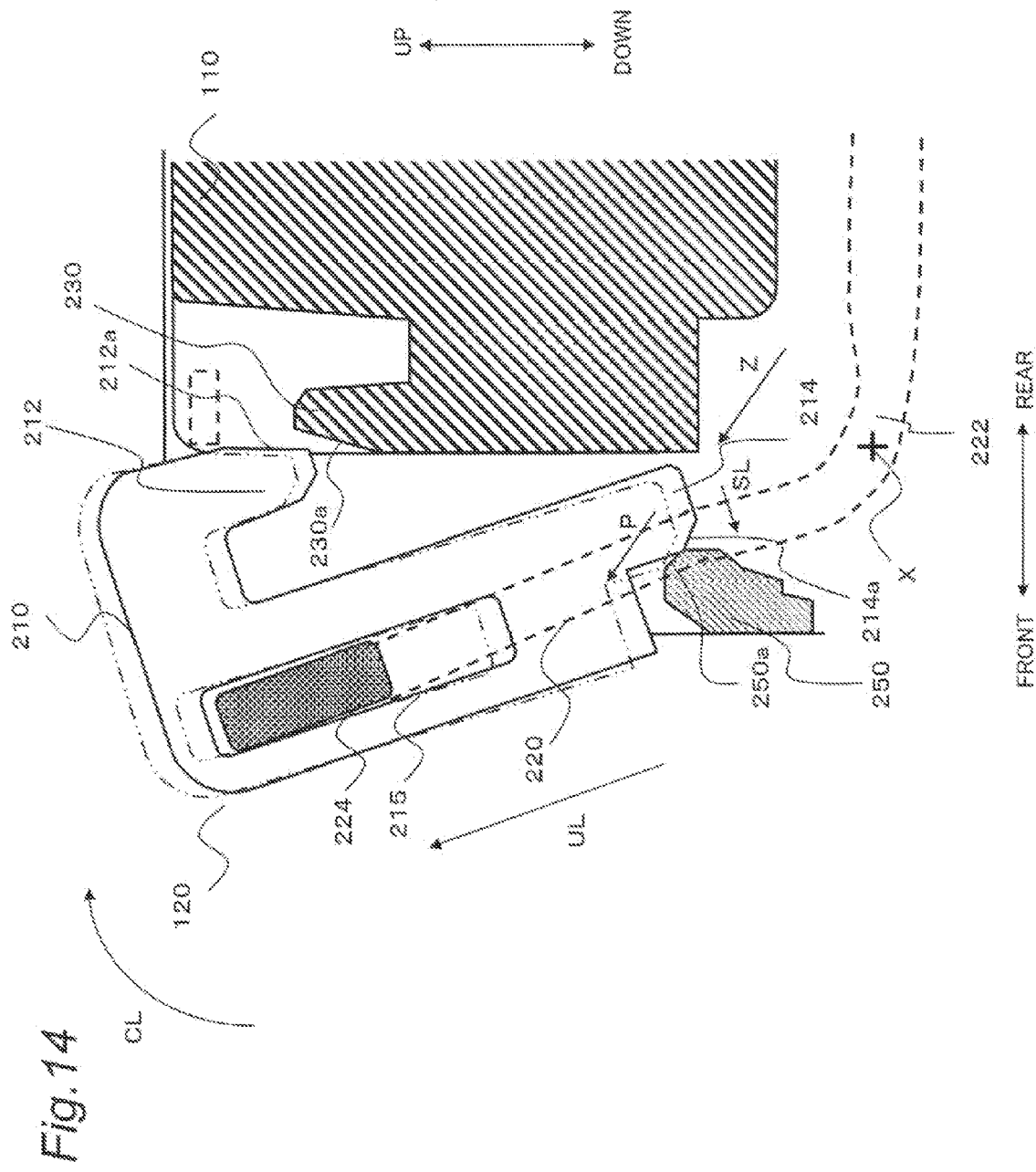
FIG. 14 is a cross-sectional view of the lid and the area around the lid of the electronic device of the embodiment in a state where the electronic device is in the fourth state, and a guide portion and a protective portion are in contact with each other.

More specifically, as shown in FIG. 14, the inclined surface 214a is formed by chamfering a front side of the lower end portion of the protective portion 214. Further, the inclined surface 250a is formed by chamfering a rear side of the upper end portion of the guide portion 250. The inclined surface 250a is formed by chamfering such that an angle made by the inclined surface 250a and the vertical direction (the thickness direction of the electronic device 100) when the lid 120 is in a closed state is substantially equal to an angle of the inclined surface 214a of the protective portion 214.

Further, the hinge portion 222 biases the vertical wall portion 220a in the opening direction as described above.

When the lid 120 is rotated in the direction indicated by an arrow CL shown in FIG. 13 to take a closed state from a state shown in FIG. 13 (a state where the first lid-side engaging portions 212 and the first case-side engaging portions 230 does not collide against (are not in contact with) each other), as shown in FIG. 14, prior to the collision between the first lid-side engaging portions 212 and the first case-side engaging portions 230, end portions of the inclined surfaces 214a of the protective portions 214 are brought into contact with the inclined surfaces 250a of the guide portions 250. When the end portions of the inclined surfaces 214a are brought into contact with the inclined surfaces 250a, a force UL generated due to a rotation movement of the lid 120 acts on the outer lid 210. The reason is as follows.

That is, although the inner lid 220 includes the hinge portion 222, the hinge portion 222 is used as a hinge by bending a resin plate as described above. Accordingly, when the hinge portion 222 is in a bent state, a restoring force is generated in the hinge portion 222 due to elasticity of the hinge portion 222. The restoring force intends to restore a flat state where the hinge portion 222 is not bent. The restoring force is generated in the direction indicated by an arrow SL in FIG. 14. Accordingly, when the end portions of the inclined surfaces 214a of the protective portions 214 are brought into contact with the inclined surfaces 250a of the guide portions 250, due to a restoring force of the hinge portion 222, the protective portions 214 positioned close to the hinge portion 222 are pushed to the inclined surfaces 250a of the guide portions 250. In such a state, when a rotational force in the direction indicated by an arrow CL is applied to an upper side of the outer lid 210 so that the hinge portion 222 is further bent, the restoring force is increased. Accordingly, the protective portions 214 positioned close to the hinge portion 222 are strongly pushed to the inclined surfaces 250a of the guide portions 250. The inclined surface 250a is formed such that a height of the inclined surface 250a is larger as the inclined surface 250a approaches the front side. Accordingly, in such a case, a component P which intends to move the protective portions 214 along the direction of the inclined surface 250a, that is, in the frontward direction as well as in the upward direction along the inclined surface 250a is applied to the protective portion 214. The component P acts as a force UL which intends to move the outer lid 210 upwardly with respect to the inner lid 220 in a sliding manner. Accordingly, the outer lid 210 is moved rearwardly and upwardly along the inclined surfaces 250a as indicated by a two-dot chain line. That is, the outer lid 210 is moved upwardly with respect to the inner lid 220 in a sliding manner. As a result, the outer lid 210 is shifted to an unlocked position. That is, prior to the collision between first lid-side engaging portions 212 and the first case-side engaging portions 230, the lid 120 is shifted to the above-mentioned third state (a state shown in FIG. 2 to FIG. 11). Accordingly, the collision between the first lid-side engaging portions 212 and the first case-side engaging portions 230 can be prevented in advance.

In this disclosure, distal ends of the protective portions 214 are inserted into the insertion ports 1110 as shown in FIG. 12. Due to such insertion, it is possible to suppress the displacement of the protective portions 214 in the lateral direction (the lateral direction shown in FIG. 12). As a result, it is possible to stabilize the rotation of the lid 120 when the electronic device 100 is in the fourth state.

In the description of the manner of operation of this embodiment, the description is made by taking the collision between the first lid-side engaging portions 212 and the first case-side engaging portions 230 as one example. However, such a collision merely constitutes one example. For example, the collision between the second lid-side engaging portions 216 and the second case-side engaging portions 240 may be prevented by making use of an action generated between the protective portions 214 and the guide portions 250. When the first lid-side engaging portions 212 or the first case-side engaging portions 230 are formed of a pawl as in the case of this embodiment, the necessity of protecting the first lid-side engaging portions 212 and the first case-side engaging portions 230 is high.

In this embodiment, the structure for preventing the breakage of the first case-side engaging portions 230 and the breakage of the first lid-side engaging portions 212 is also provided in addition to the above-mentioned structure.

More specifically, the inclined surface 230a is formed by chamfering the front side of the upper end portion of the first case-side engaging portion 230. The inclined surface 212a, 230a is formed such that as the inclined surface 212a, 230a is farther from the axis of rotation X, the inclined surface 212a, 230a becomes farther from the bottom surface 111a (predetermined surface).

Further, the inclined surface 230a is formed by chamfering the rear side of the lower end portion of the first lid-side engaging portion 212. The inclined surface 212a, 230a is formed such that as the inclined surface 212a, 230a is farther from the axis of rotation X, the inclined surface 212a, 230a becomes farther from the bottom surface 111a (predetermined surface).

Figure 15:
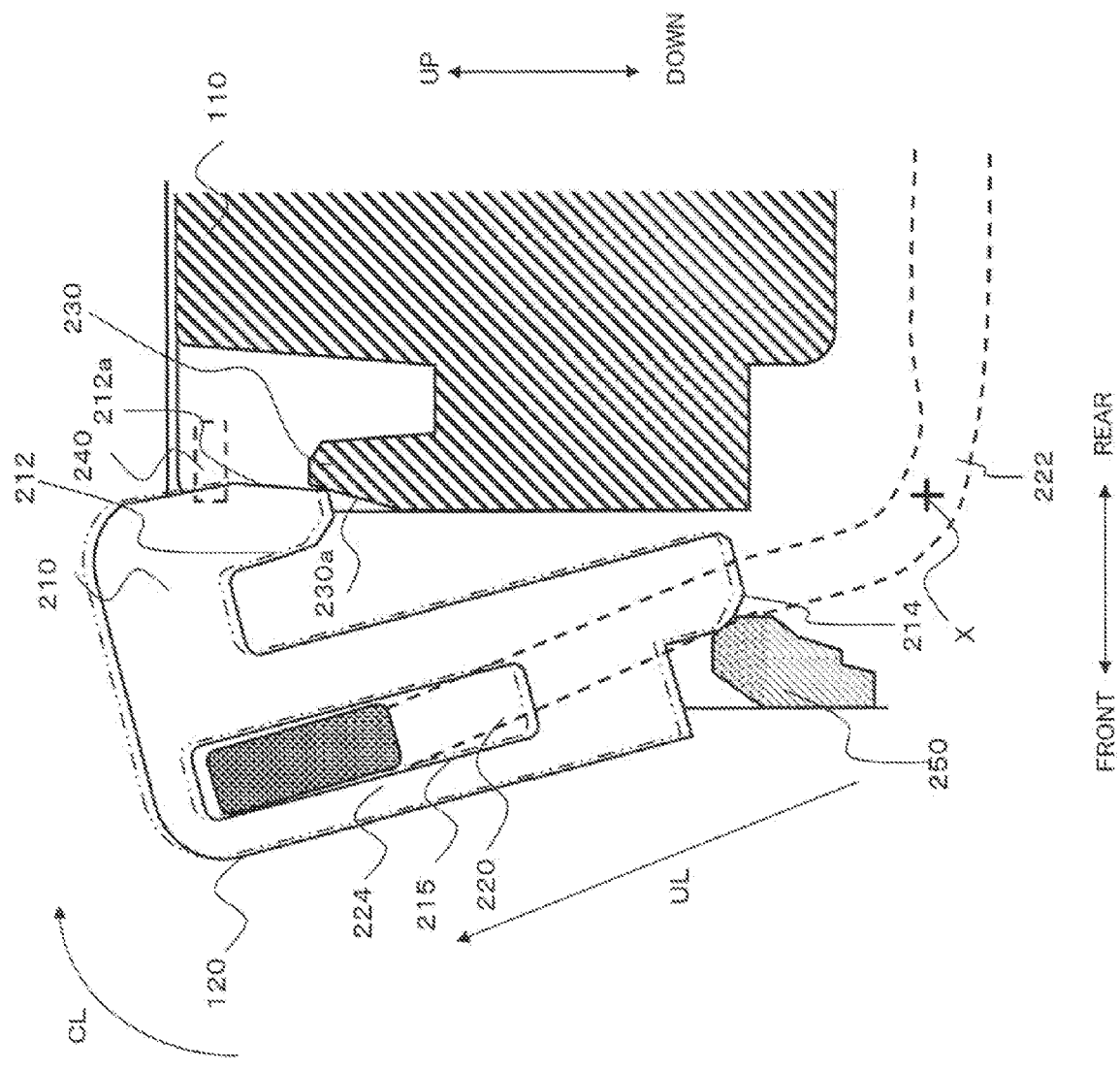
FIG. 15 is a cross-sectional view of the lid and the area around the lid of the electronic device of the embodiment in a state where the electronic device is in the fourth state, and a lid-side engaging portion and a case-side engaging portion are in contact with each other.

Due to such a configuration, even though the above-mentioned structure is provided, if the distal end sides of the first case-side engaging portions 230 are brought into contact with the distal end sides of the first lid-side engaging portions 212 as shown in FIG. 15, a force which rotates the outer lid 210 in the direction indicated by an arrow CL is converted into a force which moves the outer lid 210 in the upward direction so that the inclined surfaces 214a of the outer lid 210 are slid upwardly on the inclined surfaces 230a of the case 110. Accordingly, it is possible to alleviate the impact at the time of contact and, at the same time, the outer lid 210 can be moved upwardly with respect to the case 110 as indicated by a two-dot chain line. Accordingly, it is possible to further suppress the breakage of the lid 120.

[3. Advantageous Effect or the Like]

As has been described above, in this embodiment, the electronic device 100 of this disclosure is an electronic device which includes: the case 110 having the opening 910 on the bottom surface 111a (predetermined surface) of the recessed portion 111; and the lid 120 which is capable of taking an open state where the opening 910 is exposed and a closed state where the opening 910 is not exposed.

The lid 120 includes the inner lid 220 and the outer lid 210.

The inner lid 220 includes:

the vertical wall portion 220a (inner lid body portion) disposed approximately parallel to the bottom surface 11a when the lid 120 is in a closed state; and the hinge portion 222 which connects the vertical wall portion 220a to the case 110 such that the vertical wall portion 220a is rotatable about the axis of rotation X parallel to the bottom surface 111a.

The outer lid 210 includes:

the vertical wall portion 210a (outer lid body portion) held by the vertical wall portion 220a in a slidably movable manner in the direction orthogonal to the axis of rotation X;

the first lid-side engaging portion 212 formed on the end portion of the vertical wall portion 210a away from the axis of rotation X; and the protective portion 214 (projection) which is formed on the end portion of the vertical wall portion 210a closer to the axis of rotation X, and projects toward the axis of rotation X.

The case 110 has the first case-side engaging portion 230 which is engageable with the first lid-side engaging portion 212 in a closed state on the bottom surface 111a.

The outer lid 210 is slidably movable in the direction orthogonal to the axis of rotation X between a locked position where the first lid-side engaging portion 212 and the first case-side engaging portion 230 are brought into contact with each other at the time of rotation and an unlocked position where a contact between the first lid-side engaging portion 212 and the first case-side engaging portion at the time of rotation is alleviated.

The case 110 has the guide portion 250 (wall portion) formed at a position facing the lower end side of the bottom surface 111a in a state where the gap Z is formed between the case 110 and the bottom surface 111a.

When the lid is in a first state (first predetermined state) where the lid 120 is in a closed state and the outer lid 210 is at the locked position, the protective portion 214 of the outer lid 210 is inserted into the gap Z.

When the lid 120 is rotated in the closing direction toward the first state (first predetermined state) from the fourth state (second predetermined state) where the lid 120 is in an open state and the outer lid 210 is at a locked position, the protective portion 214 of the outer lid 210 and the guide portion 250 of the case 110 are brought into contact with each other in the gap Z.

The inclined surface 214a, 250a is formed on at least one of a portion, which is brought into contact with the guide portion 250 of the case 110, of the protective portion 214 of the outer lid 210 and a portion, which is brought into contact with the protective portion 214 of the outer lid 210, of the guide portion 250 of the case 110, wherein the inclined surface 214a, 250a is formed such that as the inclined surface 214a, 250a is farther from the axis of rotation X, the inclined surface 214a, 250a becomes farther from the bottom surface 111a.

In the electronic device of this disclosure, when the lid 120 is rotated to take a closed state to the first state (first predetermined state) from the fourth state (second predetermined state) where the lid 120 is in an open state and the outer lid 210 is at a locked position, the inclined surfaces 214a of the protective portions 214 of the outer lid 210 and the inclined surfaces 250a of the guide portions 250 of the case 110 are brought into contact with each other in the inside of the gaps Z. In such a case, the inclined surface 214a, 250a is formed such that as the inclined surface 214a, 250a is farther from the axis of rotation X, the inclined surface 214a, 250a becomes farther from the bottom surface 111a. Accordingly, when the inclined surfaces 214a of the protective portions 214 are brought into contact with the inclined surfaces 250a of the guide portions 250, the protective portions 214 are pushed to the inclined surfaces 250a of the guide portions 250 due to a restoring force (biasing force) of the hinge portion 222. Accordingly, a component P which intends to move the outer lid 210 upwardly with respect to the inner lid 220 in a sliding manner acts on the protective portion 214. The component P acts as a force UL which intends to move the outer lid 210 upwardly with respect to the inner lid 220 in a sliding manner. Due to such a force UL, the outer lid 210 is moved rearwardly and upwardly along the inclined surface 250a. As a result, a position of the outer lid 210 is shifted to an unlocked position. Due to such shifting, it is possible to prevent the collision between the first lid-side engaging portions 212 and the first case-side engaging portions 230 in advance. Accordingly, in the electronic device which includes the lid 120 having the outer lid 210 and the inner lid 220, it is possible to suppress the breakage of the case 110 and the breakage of the lid 120.

In this embodiment, the inclined surfaces 212a, 230a are formed on the first lid-side engaging portion 212 and the first case-side engaging portion 230 respectively. The inclined surface 212a, 230a is formed such that as the inclined surface 212a, 230a is farther from the axis of rotation X, the inclined surface 212a, 230a becomes closer to the bottom surface 111a (predetermined surface).

Due to such a configuration, even if the distal end sides of the first case-side engaging portions 230 are brought into contact with the distal end sides of the first lid-side engaging portions 212, the outer lid 210 can be moved upwardly with respect to the case 110. Accordingly, it is possible to further suppress the breakage of the case 110 and the breakage of the lid 120. The inclined surface may be formed on either one of the first lid-side engaging portions 212 and the first case-side engaging portions 230. Even in such a case, the outer lid 210 can be moved upwardly with respect to the case 110 when the distal end sides of the first case-side engaging portions 230 are brought into contact with the distal end sides of the first lid-side engaging portion 212.

In this embodiment, outer lid-side projections 218, 219 are formed on a vertical wall portion 210a (outer lid body portion) of the outer lid 210, and inner lid-side projections 226, 227 are formed on a vertical wall portion 220a (inner lid body portion) of the inner lid 220. The outer lid-side projections 218, 219 and the inner lid-side projections 226, 227 hold a state where the outer lid 210 is at an unlocked position. Further, the outer lid-side projections 218, 219 and the inner lid-side projections 226, 227 are engageable with each other.

Due to the formation of the outer lid-side projections 218, 219 and the inner lid-side projections 226, 227, a state where the outer lid 210 is at an unlocked position is held. Accordingly, it is possible to suppress the change of a position of the outer lid 210 from an unlocked position when the direction of the electronic device 100 is changed. Further, it is possible to suppress a case where a user erroneously or unconsciously moves the lid 120 to a locked position when the lid 120 is in an open state and the outer lid 120 is in an unlocked position. Accordingly, it is possible to further suppress the breakage of the case 110 and the breakage of the lid 120.

(Another Embodiment)

As described above, the embodiment has been described as an example of the techniques disclosed by this application. However, the technique according to this disclosure is not limited to the embodiment, and is also applicable to an embodiment to which changes, replacements, additions, omissions and the like are made. Further, a novel embodiment also may be made by combining the respective constitutional elements described in the above-mentioned embodiment.

Figure 16C:
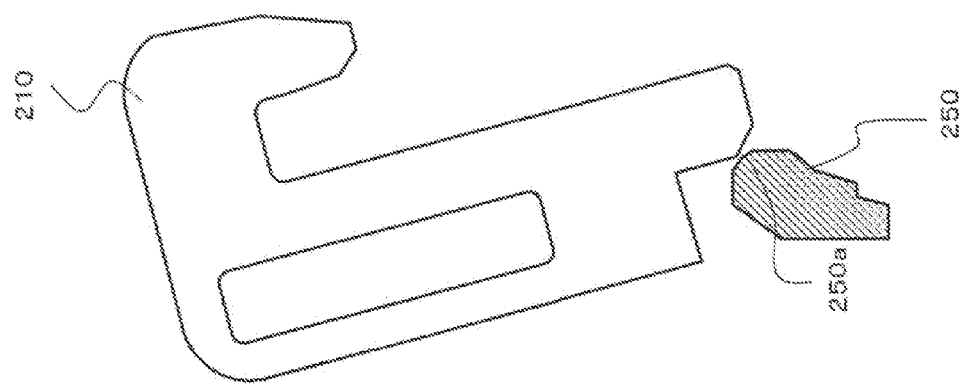
FIGS. 16A to 16C are cross-sectional views of a guide portion and a protective portion in another embodiment.
Figure 16B:
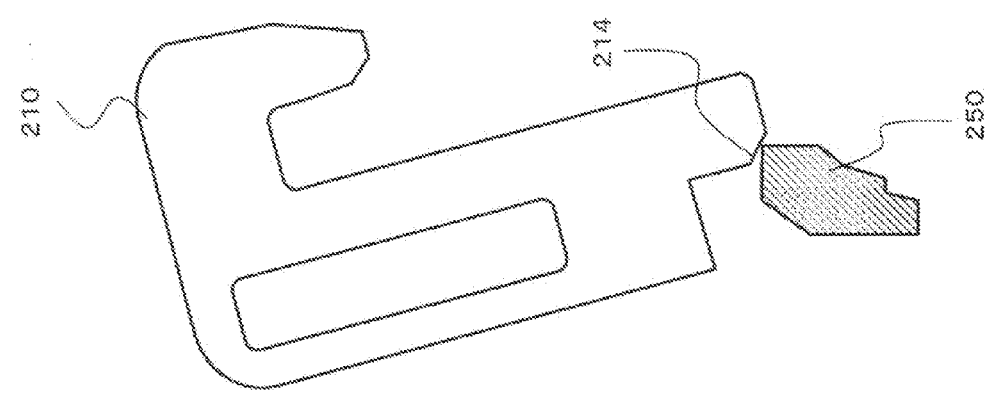
Figure 16A:
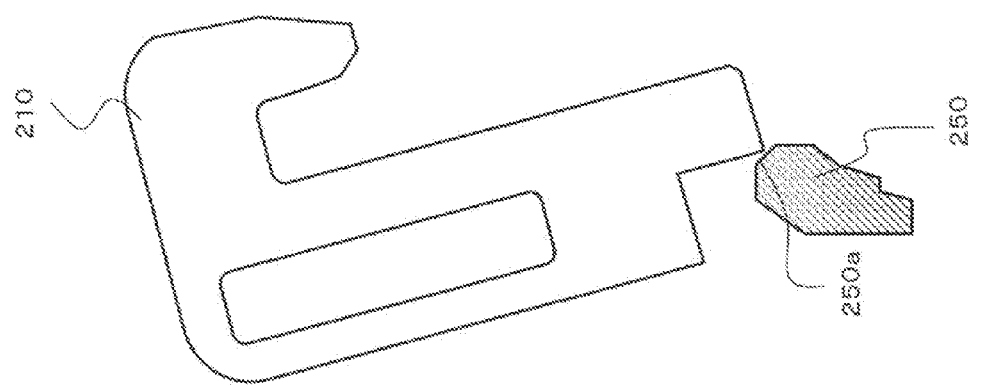

In the embodiment, the inclined surfaces 250a are formed on the guide portion 250, and the inclined surfaces 214a are formed on the protective portions 214. However, as shown in FIG. 16A, only the inclined surfaces 250a may be formed on the guide portions 250. Further, as shown in FIG. 16B, only the inclined surface 250a may be formed on the protective portions 214.

In the embodiment, the inclined surfaces 250a, 214a are linearly chamfered as viewed in a side view. However, the inclined surfaces may be chamfered in an arcuate shape as viewed in a side view. FIG. 16C shows one example where the inclined surface 250a of the guide portion 250 is chamfered in an arcuate shape. Although not shown in the figure, the inclined surface of the protective portion may be chamfered in an arcuate shape as viewed in a side view. Alternatively, both of the inclined surface of the guide portion and the inclined surface of the protective portion may be chamfered in an arcuate shape as viewed in a side view. By forming the inclined surface into an arcuate shape as viewed in a side view, the guide portion 250 and the protective portion 214 can be more smoothly moved in a relative manner when the guide portion 250 and the protective portion 214 are brought into contact with each other.

In the embodiment, a case is described where the electronic device of this disclosure is applied to a tablet computer. However, the electronic device of this disclosure is not limited to tablet computers. The electronic device of this disclosure is also widely applicable to smartphones, laptop computers, portable audio players, television receiving apparatus, refrigerator, air conditioners and the like in addition to tablet computers.

The embodiment has been described heretofore as an example of the technique according to this disclosure. For this purpose, the attached drawings and the detailed description are provided.

Accordingly, the constitutional elements described in the attached drawings and the detailed description may also include not only the constitutional elements necessary for solving the problems but also constitutional elements which are unnecessary for solving the problems in order to exemplify the aforementioned techniques. Therefore, such unnecessary constitutional elements should not be immediately determined to be necessary, for the reason that these unnecessary constitutional elements are described in the attached drawings and the detailed description.

Further, the aforementioned embodiment is merely for exemplifying the techniques according to this disclosure and, therefore, various changes, replacements, additions, omissions and the like can be made thereto within the scope of the claims and scopes equivalent thereto.

INDUSTRIAL APPLICABILITY

This disclosure is applicable to an electronic device having a lid. More specifically, this disclosure is applicable to tablet computers, smartphones, laptop computers, portable audio players, television receiving apparatus, air conditioners, refrigerators and the like.

What is claimed is:

1. An electronic device comprising:
a case having an opening on a predetermined surface; and
a lid which is capable of taking an open state where the opening is exposed and a closed state where the opening is not exposed,
the lid includes an inner lid and an outer lid,
the inner lid includes:
an inner lid body portion disposed approximately parallel to the predetermined surface when the lid is in a closed state; and
a hinge portion which connects the inner lid body portion to the case such that the inner lid body portion is rotatable about an axis of rotation parallel to the predetermined surface,
the outer lid includes:
an outer lid body portion held by the inner lid body portion in a slidably movable manner in the direction orthogonal to the axis of rotation;
a lid-side engaging portion formed on an end portion of the outer lid body portion away from the axis of rotation; and
a projection which is formed on an end portion of the outer lid body portion closer to the axis of rotation, and projects toward the axis of rotation,
the case has a case-side engaging portion which is engageable with a lid-side engaging portion in a closed state on the predetermined surface thereof,
the outer lid is slidably movable in the direction orthogonal to the axis of rotation between a locked position where the lid-side engaging portion and the case-side engaging portion are brought into contact with each other at the time of rotation and an unlocked position where a contact between the lid-side engaging portion and the case-side engaging portion at the time of rotation is alleviated,
the case has a wall portion formed at a position facing a lower end side of the predetermined surface in a state where a gap is formed between the wall portion and the predetermined surface, the wall portion is disposed so as to overlap the predetermined surface when viewed from a direction perpendicular to the predetermined surface,
when the lid is in a first predetermined state where the lid is in a closed state and the outer lid is at the locked position, the projection of the outer lid is inserted into the gap,
when the lid is rotated in the closing direction toward the first predetermined state from a second predetermined state where the lid is in an open state and the outer lid at a locked position, the projection of the outer lid and a wall portion of the case are brought into contact with each other in the gap,
an inclined surface is formed on at least one of a portion, which is brought into contact with the wall portion of the case, of the projection of the outer lid and a portion, which is brought into contact with the projection of the outer lid, of the wall portion of the case, wherein the inclined surface is formed in an inclined manner such that as the inclined surface is farther from the axis of rotation, the inclined surface becomes farther from the predetermined surface.

2. The electronic device according to claim 1, wherein an inclined surface is formed on the first lid-side engaging portion and the first case-side engaging portion respectively, the inclined surface being formed such that as the inclined surface is farther from the axis of rotation, the inclined surface becomes closer to the predetermined surface.

3. The electronic device according to claim 1, wherein outer lid-side projections are formed on an outer lid body portion of the outer lid, and inner lid-side projections are formed on an inner lid body portion of the inner lid, the outer lid-side projections and the inner lid-side projections hold a state where the outer lid is at an unlocked position, further, the outer lid-side projections and the inner lid-side projections are engageable with each other.

* * * * *